United States Patent
Kubouchi

(10) Patent No.: US 12,288,787 B2
(45) Date of Patent: Apr. 29, 2025

(54) SEMICONDUCTOR DEVICE

(71) Applicant: FUJI ELECTRIC CO., LTD., Kanagawa (JP)

(72) Inventor: Motoyoshi Kubouchi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 414 days.

(21) Appl. No.: 17/700,519

(22) Filed: Mar. 22, 2022

(65) Prior Publication Data
US 2022/0375933 A1    Nov. 24, 2022

(30) Foreign Application Priority Data
May 21, 2021 (JP) .................. 2021-086533

(51) Int. Cl.
*H01L 21/00* (2006.01)
*H01L 27/082* (2006.01)

(52) U.S. Cl.
CPC .............................. *H01L 27/0823* (2013.01)

(58) Field of Classification Search
CPC .................................................. H01L 27/0823
See application file for complete search history.

(56) References Cited

U.S. PATENT DOCUMENTS

| | | | |
|---|---|---|---|
| 11,239,234 B2 | 2/2022 | Obata | |
| 11,264,491 B2* | 3/2022 | Ozaki | H01L 21/8234 |
| 2015/0179758 A1 | 6/2015 | Ata | |
| 2017/0222029 A1 | 8/2017 | Kono | |
| 2019/0013313 A1* | 1/2019 | Naito | H01L 27/0664 |
| 2020/0144149 A1 | 5/2020 | Kubouchi | |
| 2021/0151589 A1 | 5/2021 | Shoji | |

FOREIGN PATENT DOCUMENTS

| | | |
|---|---|---|
| JP | 2011044529 A | 3/2011 |
| JP | 2017135339 A | 8/2017 |
| JP | 2018067624 A | 4/2018 |
| JP | 2018182221 A | 11/2018 |
| JP | 2020077674 A | 5/2020 |
| JP | 2020191422 A | 11/2020 |
| WO | 2014013618 A1 | 1/2014 |
| WO | 2015185742 A1 | 12/2015 |
| WO | 2019116696 A1 | 6/2019 |
| WO | 2020077674 A1 | 4/2020 |
| WO | 2020162012 A1 | 8/2020 |

OTHER PUBLICATIONS

Office Action issued for counterpart Japanese Application No. 2021-086533, transmitted from the Japanese Patent Office on Jan. 28, 2025 (drafted on Jan. 20, 2025).

* cited by examiner

*Primary Examiner* — Richard A Booth

(57) ABSTRACT

A semiconductor device includes a semiconductor substrate including an active region and an outer peripheral region. The active region includes a transistor portion and a diode portion. The outer peripheral region includes a current sensing unit. A lifetime control region including a lifetime killer is provided from the diode portion to at least a part of the transistor portion. The current sensing unit includes a sense transistor non-irradiation region not provided with the lifetime control region and a sense transistor irradiation region provided with the lifetime control region.

20 Claims, 24 Drawing Sheets

SEMICONDUCTOR DEVICE

The contents of the following Japanese patent application(s) are incorporated herein by reference:
NO. 2021-086533 filed in JP on May 21, 2021

BACKGROUND

1. Technical Field

The present invention relates to a semiconductor device.

2. Related Art

Conventionally, in a semiconductor device in which a transistor portion such as an insulated gate bipolar transistor (IGBT) and a diode portion are formed on the same substrate, there is known a technique of irradiating a predetermined depth position of a semiconductor substrate with a particle beam such as helium ions to provide a lifetime control region including a lifetime killer (for example, Patent Document 1). In addition, a semiconductor device having a current sensing unit has been known (for example, see Patent Documents 2 and 3).
Patent Document 1: Japanese Patent Application Publication No. 2017-135339
Patent Document 2: International Publication No. 2014/013618
Patent Document 3: Japanese Patent Application Publication No. 2018-67624

BRIEF DESCRIPTION OF THE DRAWINGS

FIG. 4F-1 is a diagram illustrating an example of the cross section a-a' of FIG. 4E
FIG. 4F-2 is a diagram illustrating an example of the cross section a-a' of FIG. 4E
FIG. 4F-3 is a diagram illustrating an example of the cross section a-a' of FIG. 4E.
FIG. 4F-4 is a diagram illustrating an example of the cross section a-a' of FIG. 4E.

DESCRIPTION OF EXEMPLARY EMBODIMENTS

Figure 1:
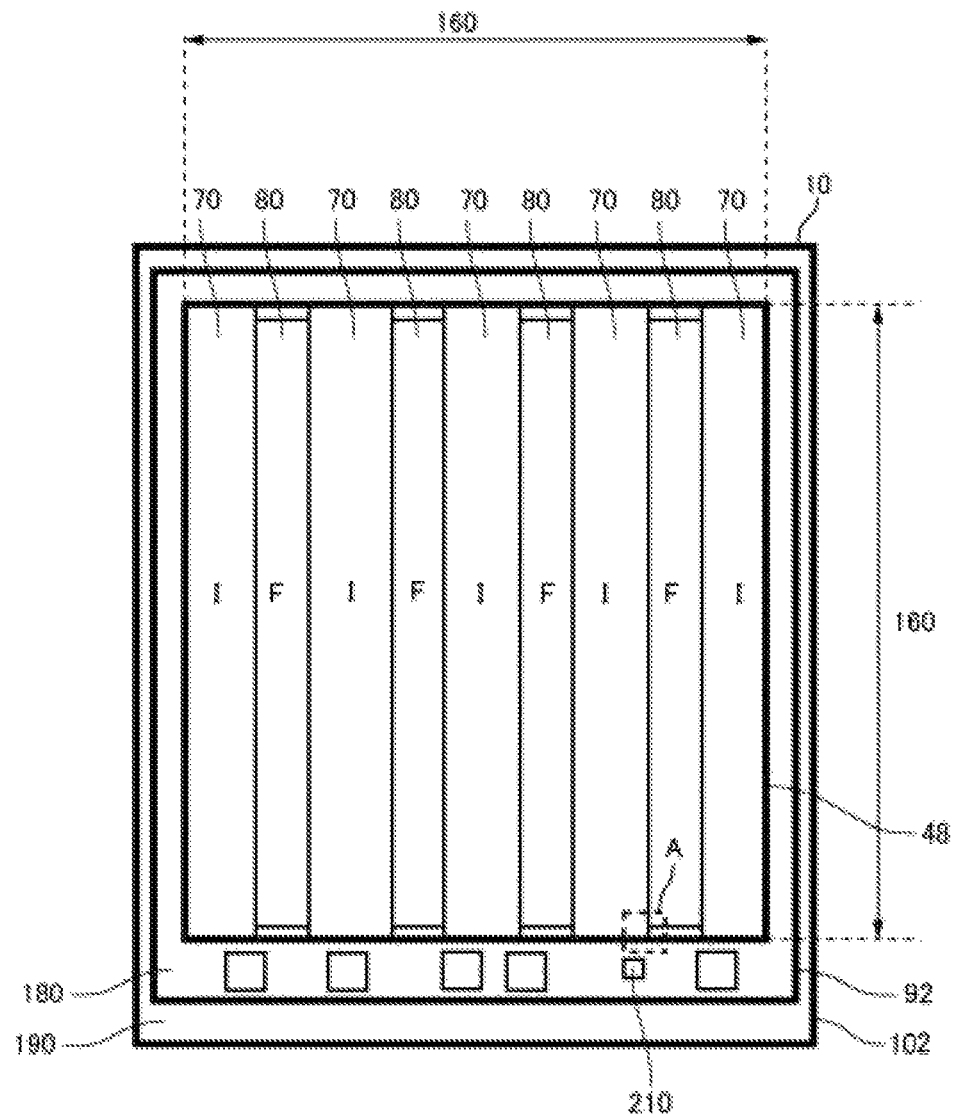
FIG. 1 is a diagram illustrating an example of an upper surface of a semiconductor device 100.

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate is referred to as "upper" or "front" and the other side is referred to as "lower" or "back". One surface of two principal surfaces of a substrate, a layer or other member is referred to as a front surface, and the other surface is referred to as a back surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the front surface and the back surface of the semiconductor substrate are referred to as the X axis and the Y axis. In addition, an axis perpendicular to the front surface and the back surface of the semiconductor substrate is referred to as the Z axis. In the present specification, the direction of the Z axis may be referred to as the depth direction. In addition, in the present specification, a direction parallel to the front surface and the back surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity type of a doping region in which doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor exhibiting a conductivity type of the N type, or a semiconductor exhibiting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is $N_D$ and the acceptor concentration is $N_A$, the net doping concentration at any position is given as $N_D$-$N_A$.

The donor has a function of supplying electrons to a semiconductor. The acceptor has a function of receiving electrons from the semiconductor. The donor and acceptor are not limited to the impurities themselves. For example, a VOH defect which is a combination of a vacancy (V), oxygen (O), and hydrogen (H) existing in the semiconductor functions as the donor that supplies electrons.

A P+ type or an N+ type described herein means that the doping concentration is higher than that of the P type or the N type, and a P− type or an N− type described herein means that the doping concentration is lower than that of the P type or the N type. In addition, a P++ type or an N++ type described herein means that the doping concentration is higher than that of the P+ type or the N+ type.

A chemical concentration in the present specification refers to the concentration of an impurity measured regardless of an electrical activation state. The chemical concentration can be measured by, for example, secondary ion mass spectrometry (SIMS). The net doping concentration described above can be measured by capacitance-voltage profiling (CV profiling). In addition, a carrier concentration measured by spreading resistance profiling method (SRP method) may be set as the net doping concentration. The carrier concentration measured by the CV profiling or the SRP method may be a value in a thermal equilibrium state. In addition, in a region of the N type, the donor concentration is sufficiently higher than the acceptor concentration, and thus the carrier concentration in the region may be set as the donor concentration. Similarly, in a region of the P type, the carrier concentration in the region may be set as the acceptor concentration.

In addition, when a concentration distribution of the donor, acceptor, or net doping has a peak in a region, a value of the peak may be set as the concentration of the donor, acceptor, or net doping in the region. When the concentration of the donor, acceptor or net doping is substantially uniform in a region, or the like, an average value of the concentration of the donor, acceptor or net doping in the region may be set as the concentration of the donor, acceptor or net doping.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder of a crystal structure caused by a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 is a diagram illustrating an example of the upper surface of a semiconductor device 100. FIG. 1 illustrates a position of each member projected onto the front surface of a semiconductor substrate 10. In FIG. 1, only some members of the semiconductor device 100 are illustrated, while the remaining members are omitted.

The semiconductor device 100 includes the semiconductor substrate 10. The semiconductor substrate 10 has end sides 102 in a top view. In the present specification, when simply referred to as a top view, it means viewing from a front surface side of the semiconductor substrate 10. The semiconductor substrate 10 of the present example has two sets of end sides 102 facing each other in a top view. In FIG. 1, the X axis and the Y axis are parallel to one of the end sides 102. The Z axis is perpendicular to the front surface of the semiconductor substrate 10.

The semiconductor substrate 10 has an active region 160, an outer peripheral region 180, and an edge termination region 190. The active region 160 is a region through which a main current flows in the depth direction between the front surface and the back surface of the semiconductor substrate 10 when the semiconductor device 100 operates. An emitter electrode is provided above the active region 160, but omitted in FIG. 1.

In the active region 160, there is provided at least one of a transistor portion 70 which includes a transistor element such as an IGBT, and a diode portion 80 which includes a diode element such as a freewheeling diode (FWD). In the example of FIG. 1, the transistor portion 70 and the diode portion 80 are disposed alternately in a stripe shape along a predetermined arrangement direction (the X axis direction in the present example) at the front surface of the semiconductor substrate 10. In another example, in the active region 160, the diode portion 80 may be disposed in the transistor portion 70 in a lattice pattern.

In FIG. 1, a region in which the transistor portion 70 is disposed is denoted by a symbol "I", and a region in which the diode portion 80 is disposed is denoted by a symbol "F". In the present specification, a direction perpendicular to the arrangement direction in a top view may be referred to as an extending direction (Y axis direction in FIG. 1). Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction.

The width of the transistor portion 70 is larger than the width of the diode portion 80 in the X axis direction. In addition, the width of the transistor portion 70 in the X axis direction may be the same as the width of the diode portion 80 in the X axis direction. The extending direction of the transistor portion 70 and the diode portion 80 may be the same as the longitudinal direction of each trench portion to be described later.

The diode portion 80 has an N+ type cathode region in a region in contact with the back surface of the semiconductor substrate 10. In the present specification, a region in which the cathode region is provided is referred to as a diode portion 80. That is, the diode portion 80 is a region overlapping the cathode region in a top view. On the back surface of the semiconductor substrate 10, a P+ type collector region may be provided in a region other than the cathode region. In the present specification, an extension region obtained by extending the diode portion 80 in the Y axis direction to a gate runner to be described later may also be included in the diode portion 80. A collector region is provided in a lower surface of the extension region.

The transistor portion 70 has a P+ type collector region in a region in contact with the back surface of the semiconductor substrate 10. In the transistor portion 70, a gate structure including an N type emitter region, a P type base region, a gate conductive portion, and a gate dielectric film is periodically disposed in the front surface side of the semiconductor substrate 10.

The semiconductor device 100 includes a gate runner 48 which electrically connects the conductive portion of the gate trench portion to a gate pad. The gate runner 48 is disposed between the active region 160 and the end side 102 of the semiconductor substrate 10 in a top view. The gate runner 48 of the present example surrounds the active region 160 in a top view. In a top view, a region surrounded by the gate runner 48 may be the active region 160, and a region from the end of the gate runner 48 to the end side 102 may be the outer peripheral region 180.

The gate runner 48 is disposed above the semiconductor substrate 10. The gate runner 48 of the present example may be formed, for example, of polysilicon doped with impurities. The gate runner 48 is electrically connected to a gate conductive portion provided in the gate trench portion via a gate dielectric film.

The outer peripheral region 180 surrounds the active region 160. The outer peripheral region 180 may have one or more pads provided above the semiconductor substrate 10. As an example, the semiconductor device 100 includes pads such as an anode pad, a cathode pad, and a current detection pad. Each pad may be connected to an external circuit via wiring such as a wire.

The outer peripheral region 180 includes a current sensing unit 210. The current sensing unit 210 detects a current flowing in the transistor portion 70. The outer peripheral region 180 may further have a temperature sensing portion which is a PN junction diode formed of polysilicon or the like. A current sensing emitter electrode 53 is provided above the current sensing unit 210, but omitted in FIG. 1.

The edge termination region 190 of the present example is disposed between the outer peripheral region 180 and the end side 102. The edge termination region 190 reduces electric field concentration in the front surface side of the semiconductor substrate 10.

The edge termination region 190 may have a guard ring 92. The guard ring 92 is a P type region in contact with the front surface of the semiconductor substrate 10. Note that the edge termination region 190 of the present example includes a plurality of guard rings 92, but only one guard ring 92 is illustrated in FIG. 1 while the other rings are omitted. Providing the plurality of guard rings 92 allows the depletion layer on the upper surface side of the active region 160 to be extended outward, which can improve the breakdown voltage of the semiconductor device 100. The edge termination region 190 may further include at least one of a field plate, and a RESURF annularly provided surrounding the outer peripheral region 180.

Note that a passivation layer 230 is provided above the semiconductor substrate 10, but omitted in FIG. 1. The passivation layer 230 is a protection film formed of polyimide or the like and covering the entire front surface side of the semiconductor substrate 10. The passivation layer 230 may have openings at positions corresponding to pads, wires, and the like provided in the outer peripheral region 180.

Figure 2A:
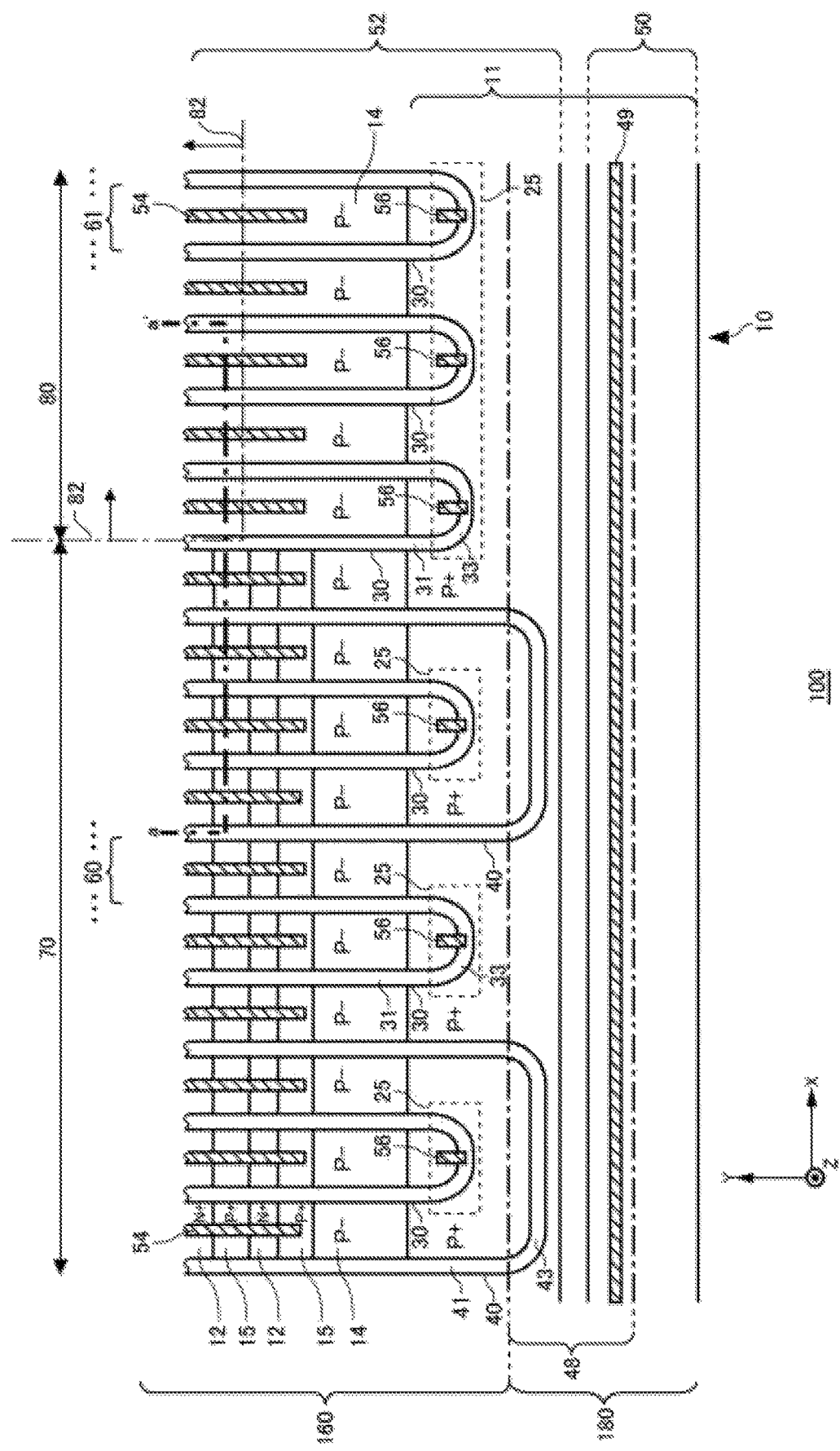
FIG. 2A is an enlarged top view of a region A of FIG. 1.

FIG. 2A is an enlarged top view of a region A of FIG. 1. The semiconductor device 100 includes a semiconductor substrate having the transistor portion 70 including a transistor element such as an IGBT and a diode portion 80 including a diode element such as a freewheeling diode (FWD).

The semiconductor device 100 of the present example includes a gate trench portion 40, a dummy trench portion 30, a well region 11, an emitter region 12, a base region 14, and a contact region 15 provided in the front surface side of the semiconductor substrate 10. The gate trench portion 40 and the dummy trench portion 30 are each an example of a trench portion.

In addition, the semiconductor device 100 of the present example includes a gate metal layer 50 and an emitter electrode 52 that are provided above the front surface of the semiconductor substrate 10. The gate metal layer 50 and the emitter electrode 52 are provided to be separated from each other. The gate metal layer 50 and the emitter electrode 52 are electrically insulated.

An interlayer dielectric film is provided between the emitter electrode 52 and the gate metal layer 50 and the front surface of the semiconductor substrate 10, but is omitted in FIG. 2A. In the interlayer dielectric film of the present example, contact holes 49, 54, and 56 are provided through the interlayer dielectric film. In FIG. 2A, each contact hole is hatched with oblique lines.

The emitter electrode 52 is provided above the gate trench portion 40, the dummy trench portion 30, the well region 11, the emitter region 12, the base region 14, and the contact region 15. The emitter electrode 52 is electrically connected to the emitter region 12, the base region 14, and the contact region 15 at the front surface of the semiconductor substrate 10 through the contact hole 54.

In addition, the emitter electrode 52 is connected to a dummy conductive portion in the dummy trench portion 30 through the contact hole 56. A connecting portion 25 formed of a material having conductivity such as polysilicon doped with impurities may be provided between the emitter electrode 52 and the dummy conductive portion. The connecting portion 25 is provided at the front surface of the semiconductor substrate via a dielectric film such as an interlayer dielectric film and a dummy dielectric film of the dummy trench portion 30.

The gate metal layer 50 is electrically connected to the gate runner 48 through the contact hole 49. The gate runner 48 may be formed of polysilicon doped with impurities or the like. The gate runner 48 is connected to the gate conductive portion in the gate trench portion 40 at the front surface of the semiconductor substrate 10. The gate runner 48 is not electrically connected to the dummy conductive portion in the dummy trench portion 30 and the emitter electrode 52.

The gate runner 48 and the emitter electrode 52 are electrically separated from each other by an insulator such as an interlayer dielectric film and an oxide film. The gate runner 48 of the present example is provided from below the contact hole 49 to the edge portion of the gate trench portion 40. At the edge portion of the gate trench portion 40, the gate conductive portion is exposed at the front surface of the semiconductor substrate to be connected to the gate runner 48.

The emitter electrode 52 and the gate metal layer 50 are formed of a conductive material containing metal. For example, they are formed of aluminum or an aluminum-silicon alloy. Each electrode may have a barrier metal formed of titanium, a titanium compound, or the like in a lower layer of a region formed of aluminum or the like.

Each electrode may have a plug formed of tungsten or the like in the contact hole. The plug may have a barrier metal on the side in contact with the semiconductor substrate 10, may be embedded with tungsten so as to be in contact with the barrier metal, and may be formed of aluminum or the like on tungsten.

Note that the plug is provided in the contact hole in contact with the contact region 15 or the base region 14. In addition, a P++ type plug region is formed below the contact hole of the plug so as to have a doping concentration higher than that of the contact region 15. This can improve the contact resistance between the barrier metal and the contact region 15. In addition, the plug region has a depth of about 0.1 µm or less, and has a small area with its depth being as small as 10% or less as the depth of the contact region 15.

The plug region improves contact resistance, which improves latch-up resistance in the operation of the transistor portion 70. On the other hand, in the operation of the diode portion 80, increase in conduction loss and switching loss can be suppressed.

The well region 11 is extended so as to overlap with the outer peripheral region 180 from the gate runner 48, and is provided annularly in a top view. The well region 11 is also extended in a predetermined width in the active region 160 inside the gate runner 48, and is provided annularly in a top view. The well region 11 of the present example is provided in a range separated from the end portion of the contact hole 54 in the Y axis direction toward the gate runner 48. The well region 11 is a region of a second conductivity type having a doping concentration higher than that of the base region 14. The doping concentration of the well region 11 may be the same as or lower than the doping concentration of the contact region 15. The gate runner 48 is electrically insulated from the well region 11.

The base region 14 of the present example is a P− type, and the well region 11 is a P+ type. In addition, the well region 11 is formed from the front surface of the semiconductor substrate to a position deeper than the lower end of the base region 14. The base region 14 is provided in contact with the well region 11 in the transistor portion 70 and the diode portion 80. The well region 11 is electrically connected to the emitter electrode 52.

Each of the transistor portion 70 and the diode portion 80 includes a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 is provided along the arrangement direction.

The gate trench portion 40 of the present example may have two extension portions 41) extending along the extending direction perpendicular to the arrangement direction (portions of the trenches that are straight along the extending direction), and a connecting portion 43 connecting the two extension portions 41.

At least a part of the connecting portion 43 may be provided in a curved shape in a top view. The end portions of the two extension portions 41 in the Y axis direction are connected to the gate runner 48 by the connecting portion 43, thereby functioning as a gate electrode to the gate trench portion 40. On the other hand, forming the connecting portion 43 in a curved shape allows more reduction in electric field strength at the end portion than terminating at the extension portion 41.

In the transistor portion 70, the dummy trench portion 30 is provided between the respective extension portions 41 of the gate trench portion 40. Although two dummy trench portions 30 are provided between the respective extension portions 41 in the example of FIG. 2A, one dummy trench portion 30 may be provided, or more than two dummy trench portions 30 may be provided.

In addition, between the respective extension portions 41, the dummy trench portion 30 may not be provided, and the gate trench portion 40 may be provided. Such a structure allows increase in electron current from the emitter region 12, which thus reduces the ON voltage.

The dummy trench portion 30 may have a linear shape extending in the extending direction, and may have an extension portion 31 and a connecting portion 33 similarly to the gate trench portion 40. In the semiconductor device 100 illustrated in FIG. 2A, only the dummy trench portions 30 including the connecting portion 33 are arranged, but in another example, the semiconductor device 100 may include a linear dummy trench portion 30 having no connecting portion 33.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction (negative side in the Z axis direction) is covered with the well region 11 at the end portion of each trench portion in the Y axis direction. This can consequently reduce electric field strength at the bottom portion of each trench portion.

A mesa portion is provided between the trench portions in the arrangement direction. The mesa portion refers to a region sandwiched between the trench portions inside the semiconductor substrate 10. As an example, the depth position of the mesa portion is from the front surface of the semiconductor substrate to the lower end of the trench portion.

The mesa portion of the present example is sandwiched between adjacent trench portions in the X axis direction, and is provided to extend in the extending direction (Y axis direction) along the trench at the front surface of the semiconductor substrate 10. As described later with FIG. 2B, in the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In each mesa portion, at least one of the emitter region 12 of the first conductivity type and the contact region 15 of the second conductivity type may be provided in a region sandwiched between the base regions 14 in a top view. The emitter region 12 of the present example is an N+ type, and the contact region 15 is a P+ type. The emitter region 12 and the contact region 15 may be provided between the base region 14 and the front surface of the semiconductor substrate 10 in the depth direction.

The mesa portion of the transistor portion 70 includes the emitter region 12 exposed at the front surface of the semiconductor substrate 10. The emitter region 12 is provided in contact with the gate trench portion 40. The mesa portion in contact with the gate trench portion 40 is provided with the contact region 15 exposed at the front surface of the semiconductor substrate 10.

Each of the contact region 15 and the emitter region 12 in the mesa portion is provided from one trench portion to the other trench portion in the X axis direction. As an example, the contact regions 15 and the emitter regions 12 of the mesa portion are alternately disposed along the extending direction (Y axis direction) of the trench portion.

In another example, the contact region 15 and the emitter region 12 of the mesa portion may be provided in a stripe shape along the extending direction (Y axis direction) of the trench portion. For example, the emitter region 12 is provided in a region in contact with the trench portion, and the contact region 15 is provided in a region sandwiched between the emitter regions 12.

The emitter region 12 is not provided in the mesa portion of the diode portion 80. The base region 14 may be provided in the upper surface of the mesa portion of the diode portion 80. The base region 14 may be disposed in the entire mesa portion of the diode portion 80.

The contact hole 54 is provided above each mesa portion. The contact hole 54 is, in its extending direction (Y axis direction), disposed in a region sandwiched between the base regions 14. The contact hole 54 of the present example is provided above each of the contact region 15, the base region 14, and the emitter region 12. The contact hole 54 may be disposed at the center in the arrangement direction (X axis direction) of the mesa portion.

In the diode portion 80, an N+ type cathode region 82 is provided in a region adjacent to the back surface of the semiconductor substrate. In the back surface of the semiconductor substrate, a P+ type collector region 22 may be provided in a region in which the cathode region 82 is not provided. In FIG. 2A, the boundary between the cathode region 82 and the collector region 22 is indicated by a dotted line.

The cathode region 82 is disposed away from the well region 11 in the Y axis direction. This can consequently ensure a distance between the cathode region 82 and the P type region (well region 11) having a relatively high doping concentration and formed up to a deep position to suppress hole injection from the well region 11, and thus can reduce the reverse recovery loss. The end portion of the cathode region 82 in the Y axis direction of the present example is disposed further away from the well region 11 than the end portion of the contact hole 54 in the Y axis direction. In another example, the end portion of the cathode region 82 in the Y axis direction may be disposed between the well region 11 and the contact hole 54.

Figure 2B:
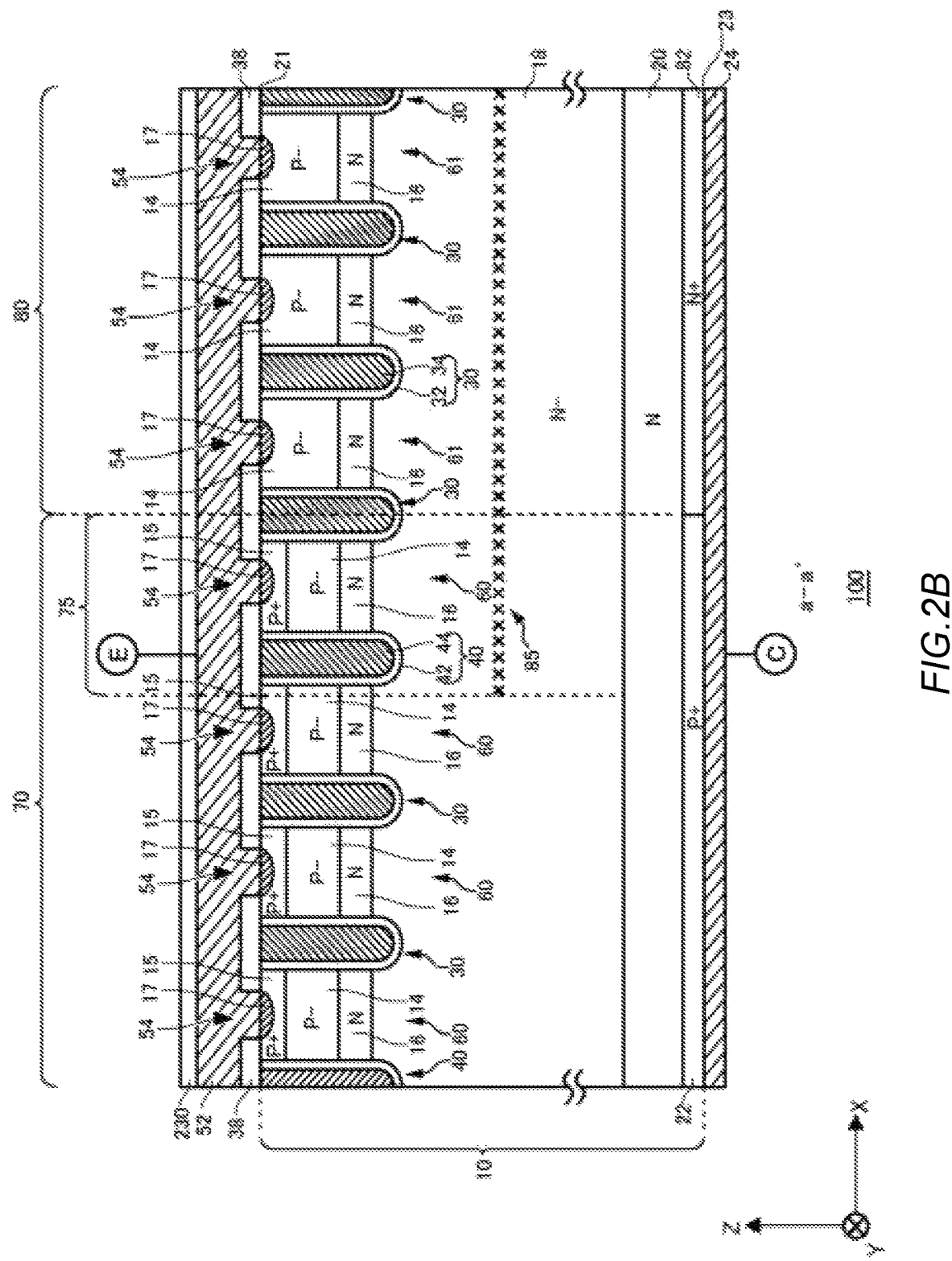
FIG. 2B is a diagram illustrating a cross section a-a' of FIG. 2A.

FIG. 2B is a diagram illustrating a cross section a-a' of FIG. 2A. The cross section a-a' is an XZ plane passing through the contact region 15, the base region 14, the gate trench portion 40, and the dummy trench portion 30. The semiconductor device 100 of the present example includes the semiconductor substrate 10, an interlayer dielectric film 38, the emitter electrode 52, and a collector electrode 24 in the cross section a-a'.

The interlayer dielectric film 38 is provided on a front surface 21 of the semiconductor substrate 10. The interlayer dielectric film 38 is a dielectric film such as silicate glass to which an impurity such as boron or phosphorus is added. The interlayer dielectric film 38 may be in contact with the front surface 21, and another film such as an oxide film may be provided between the interlayer dielectric film 38 and the front surface 21. The interlayer dielectric film 38 is provided with the contact hole 54 described in FIG. 2A.

The emitter electrode 52 is provided on the front surface 21 of the semiconductor substrate 10 and the upper surface of the interlayer dielectric film 38. The emitter electrode 52 is electrically connected to the front surface 21 through the contact hole 54 of the interlayer dielectric film 38. A plug (not illustrated) such as tungsten (W) may be embedded in the contact hole 54 via a barrier metal film. In addition, a plug region 17 may be provided in the surface layer of the semiconductor substrate 10 in which the contact hole 54 is opened. The plug region 17 is a P type. The doping concentration of the plug region 17 is higher than the doping concentration of the contact region 15.

The collector electrode 24 is provided on a back surface 23 of the semiconductor substrate 10. The emitter electrode 52 and the collector electrode 24 are formed of a material containing metal or a stacked film thereof.

The semiconductor substrate 10 may be a silicon substrate, a silicon carbide substrate, a nitride semiconductor substrate such as gallium nitride, or the like. The semiconductor substrate 10 of the present example is a silicon substrate.

The semiconductor substrate 10 includes a drift region 18 of the first conductivity type. The drift region 18 of the present example is an N– type. The drift region 18 may be a region which remains without another doping region in the semiconductor substrate 10.

Above the drift region 18, one or more accumulation regions 16 may be provided in the Z axis direction. The accumulation region 16 is a region in which the same dopant as the drift region 18 is accumulated at a concentration higher than that of the drift region 18. The doping concentration of the accumulation region 16 is higher than the doping concentration of the drift region 18.

The accumulation region 16 of the present example is an N type. The accumulation region 16 may be provided only in the transistor portion 70, or may be provided in both the transistor portion 70 and the diode portion 80. Providing the accumulation region 16 allows increase in the injection-enhancement effect (IE effect) of carriers, and thus reduction in the ON voltage.

In the transistor portion 70, the emitter region 12 is provided above the base region 14 in contact with the front surface 21. The emitter region 12 is provided in contact with the gate trench portion 40. The doping concentration of the emitter region 12 is higher than the doping concentration of the drift region 18. The dopant of the emitter region 12 is, for example, arsenic (As), phosphorus (P), antimony (Sb), or the like.

The diode portion 80 is provided with the base region 14 exposed at the front surface 21. The base region 14 of the diode portion 80 operates as an anode.

A buffer region 20 of the first conductivity type may be provided below the drift region 18. The buffer region 20 of the present example is an N type. The doping concentration of the buffer region 20 is higher than the doping concentration of the drift region 18. The buffer region 20 may function as a field stop layer that prevents a depletion layer extending from the lower surface side of the base region 14 from reaching the collector region 22 and the cathode region 82.

In the transistor portion 70, the collector region 22 is provided below the buffer region 20. The collector region 22 may be provided in contact with the cathode region 82 at the back surface 23.

In the diode portion 80, the cathode region 82 is provided below the buffer region 20. The cathode region 82 may be provided at the same depth as the collector region 22 of the transistor portion 70. The diode portion 80 may function as a freewheeling diode (FWD) that allows a freewheeling current that conducts in the reverse direction to flow when the transistor portion 70 is turned off.

The semiconductor substrate 10 is provided with the gate trench portion 40 and the dummy trench portion 30. The gate trench portion 40 and the dummy trench portion 30 are provided so as to penetrate the base region 14 and the accumulation region 16 from the front surface 21 and reach the drift region 18. The trench portion penetrating the doping region is not limited to those manufactured in the order of forming the doping region and then forming the trench portion. The doping region formed between the trench portions after forming the trench portions is also included in a doping region in which the trench portion penetrates.

The gate trench portion 40 includes a gate trench provided in the front surface 21, a gate dielectric film 42, and a gate conductive portion 44. The gate dielectric film 42 is provided to cover the inner wall of the gate trench. The gate dielectric film 42 may be formed of an oxide film or a nitride film. The gate conductive portion 44 is provided in the gate trench so as to be embedded further inside than the gate dielectric film 42. The upper surface of the gate conductive portion 44 may be in the same XY plane as the front surface 21. The gate dielectric film 42 insulates the gate conductive portion 44 from the semiconductor substrate 10. The gate conductive portion 44 is formed of polysilicon doped with impurities or the like.

The gate conductive portion 44 may be provided to be longer than the base region 14 in the depth direction. The gate trench portion 40 is covered with the interlayer dielectric film 38 in the front surface 21. If a predetermined voltage is applied to the gate conductive portion 44, a channel by an inversion layer of electrons is formed in a surface layer of an interface in contact with the gate trench in the base region 14.

The dummy trench portion 30 may have the same structure as the gate trench portion 40 in the XZ cross section. The dummy trench portion 30 includes a dummy trench provided in the front surface 21, a dummy dielectric film 32, and a dummy conductive portion 34. The dummy dielectric film 32 is provided to cover the inner wall of the dummy trench. The dummy dielectric film 32 may be formed of an oxide film or a nitride film. The dummy conductive portion 34 is provided in the dummy trench so as to be embedded further inside than the dummy dielectric film 32. The upper surface of the dummy conductive portion 34 may be in the same XY plane as the front surface 21. The dummy dielectric film 32 insulates the dummy conductive portion 34 from the semiconductor substrate 10. The dummy conductive portion 34 may be formed of the same material as the gate conductive portion 44.

The gate trench portion 40 and the dummy trench portion 30 of the present example are covered with the interlayer dielectric film 38 in the front surface 21. Note that the bottom portions of the dummy trench portion 30 and the gate trench portion 40 may be a curved surface shape protruding downward (a curved shape in a cross section).

In the diode portion 80, a lifetime control region including a lifetime killer is locally provided in the drift region 18. The lifetime killer is a crystal defect formed at a predetermined depth position of the semiconductor substrate 10 by implanting, for example, helium ions, hydrogen ions (proton, deuteron), or the like. The lifetime control region promotes recombination of holes generated in the base region 14 and electrons injected from the cathode region 82 when the diode portion 80 is turned off, and suppresses a peak current at the time of reverse recovery.

A lifetime control region 85 may be formed by irradiating proton or helium from the front surface 21 or the back surface 23 of the semiconductor substrate 10 using a mask. As an example, the transistor portion 70 and the diode portion 80 are irradiated with proton or helium through the opening of the mask while shielding the region not forming the lifetime control region 85 by the mask. The region shielded by a mask is not irradiated with proton or helium.

In FIG. 2B, a peak position of the concentration distribution of the lifetime killer in the Z axis direction is indicated by the symbol "x". The peak position of the lifetime control region 85 in the Z axis direction of the present example may be equal to the position of the lower surface of the well region 11 in the Z axis direction, or may be provided below the position of the lower surface of the well region 11 in the Z axis direction. In addition, the lifetime control region 85 may be formed so as to have a plurality of peaks of the concentration distribution of the lifetime killer in the Z axis direction.

The lifetime control region 85 of the present example is continuously provided from the diode portion 80 to at least a part of the transistor portion 70. In the transistor portion 70, a region provided with the lifetime control region 85 is called a boundary region 75. At the time of conduction of the diode portion, a hole current directed to the cathode region 82 is generated not only from the base region 14 of the diode portion 80 but also from the base region 14 of the transistor portion 70. Since the transistor portion 70 includes the boundary region 75 provided with the lifetime control region 85, carrier dissipation is accelerated and reverse recovery loss at the time of turning-off is reduced.

However, in the trench portion of the boundary region 75, the gate dielectric film 42 is damaged when being irradiated with helium or proton from the front surface 21 or the back surface 23 of the semiconductor substrate 10, and the interface level is changed. When a gate voltage is applied to the irradiated gate dielectric film 42, an inversion layer is more likely to be formed in the adjacent base region 14 than the gate dielectric film 42 which is not irradiated. Therefore, the threshold voltage is lowered in the boundary region 75 as compared with the region other than the boundary region 75 of the transistor portion 70.

Figure 3A:
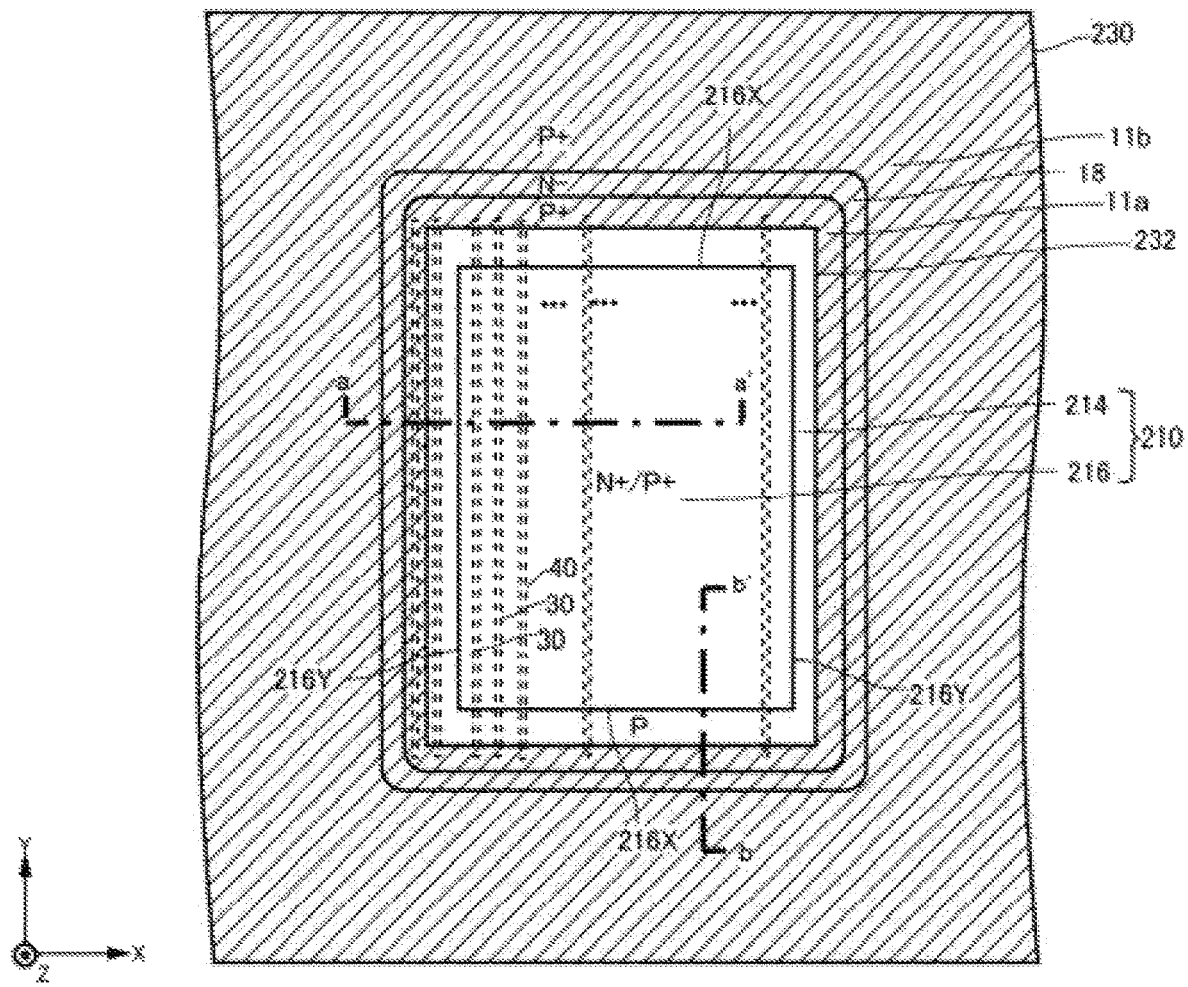
FIG. 3A is an enlarged top view near a current sensing unit 210.

FIG. 3A is an enlarged top view near the current sensing unit 210. The current sensing unit 210 of the present example is surrounded by well regions 11a and 11b. A region in which the drift region 18 is exposed at the front surface 21 is formed between the well region 11a surrounding the current sensing unit 210 and the well region 11b surrounding the well region 11a, and the well region 11a and the well region 11b are separated. The well region 11a is connected to the same potential as the current sensing emitter electrode 53 to be described later, and the well region 11b is connected to the same potential as the emitter electrode 52.

In the present example, an opening 232 of the passivation layer 230 is provided so as to overlap the current sensing unit 210. In FIG. 3A, the region other than the opening 232 in the passivation layer 230 is hatched with oblique lines.

The current sensing unit 210 includes an emitter arrangement region 216 and an emitter non-arrangement region 214. The emitter arrangement region 216 is a region in which the emitter region 12 is periodically arranged in a top view. For example, in the emitter arrangement region 216, the emitter region 12 and the contact region 15 are alternately disposed along the Y axis direction as illustrated in FIG. 2A and the like. The emitter arrangement region 216 may be a region which includes the center of the current sensing unit 210 in a top view.

The emitter non-arrangement region 214 is a region in which the emitter region 12 is not provided. A P type region may be exposed at the upper surface of the emitter non-arrangement region 214. The P type region may have the same doping concentration as the contact region 15, may have the same doping concentration as the base region 14, or may have other doping concentration.

The current sensing unit 210 of the present example has a structure similar to that of the transistor portion 70, so that the current flowing in the transistor portion 70 is simulated at a ratio corresponding to the channel area ratio in a top view. The area of the current sensing unit 210 in a top view is smaller than that of the transistor portion 70. The area of the current sensing unit 210 may be smaller than the area of each pad such as a gate pad 208 disposed in the upper surface of the semiconductor substrate 10.

Note that, the current sensing unit 210 mentioned herein may refer only to the emitter arrangement region 216 excluding the emitter non-arrangement region 214 which does not operate as a transistor.

The emitter non-arrangement region 214 is provided surrounding the emitter arrangement region 216 in a top view. As an example, the external shape of the emitter arrangement region 216 and the emitter non-arrangement region 214 in a top view is rectangular. The emitter non-arrangement region 214 is surrounded by the well region 11a in a top view. Further, the well region 11a is surrounded by the well region 11b with the drift region 18 sandwiched therebetween in a top view.

A plurality of trench portions and mesa portions are disposed in the emitter arrangement region 216 and the emitter non-arrangement region 214. In FIG. 3A, a part of the trench portion is illustrated with a broken line. Each trench portion is provided to extend in the Y axis direction. The plurality of trench portions includes the gate trench portions 40. The plurality of trench portions may further include the dummy trench portions 30. The gate trench portion 40 and the dummy trench portion 30 have a structure similar to the gate trench portion 40 and the dummy trench portion 30 provided in the transistor portion 70.

When the emitter arrangement region 216 and the emitter non-arrangement region 214 are disposed side by side in the Y axis direction, the trench portions may be continuously provided over the emitter arrangement region 216, the emitter non-arrangement region 214, and the well region 11a. The end portion of the gate trench portion 40 in the Y axis direction may be provided inside the well region 11a. This can consequently reduce electric field strength to the end portion of the gate trench portion 40.

In addition, a trench portion extending in the Y axis direction may be provided in the well region 11a. The emitter region 12 is not provided in the well region 11a.

In the example of FIG. 3A, the end portion of the opening 232 in a top view is disposed along the outer periphery of the emitter non-arrangement region 214. In another example, the end portion of the opening 232 may be disposed above the emitter non-arrangement region 214, or may be disposed along the outer periphery of the emitter arrangement region 216. Alternatively, the end portion of the opening 232 may expose the emitter non-arrangement region 214, the well regions 11a and 11b, or the drift region 18 in a top view. In addition, the emitter non-arrangement region 214 may not be provided in the end portion of the current sensing unit 210 in the X axis direction.

Figure 3B:
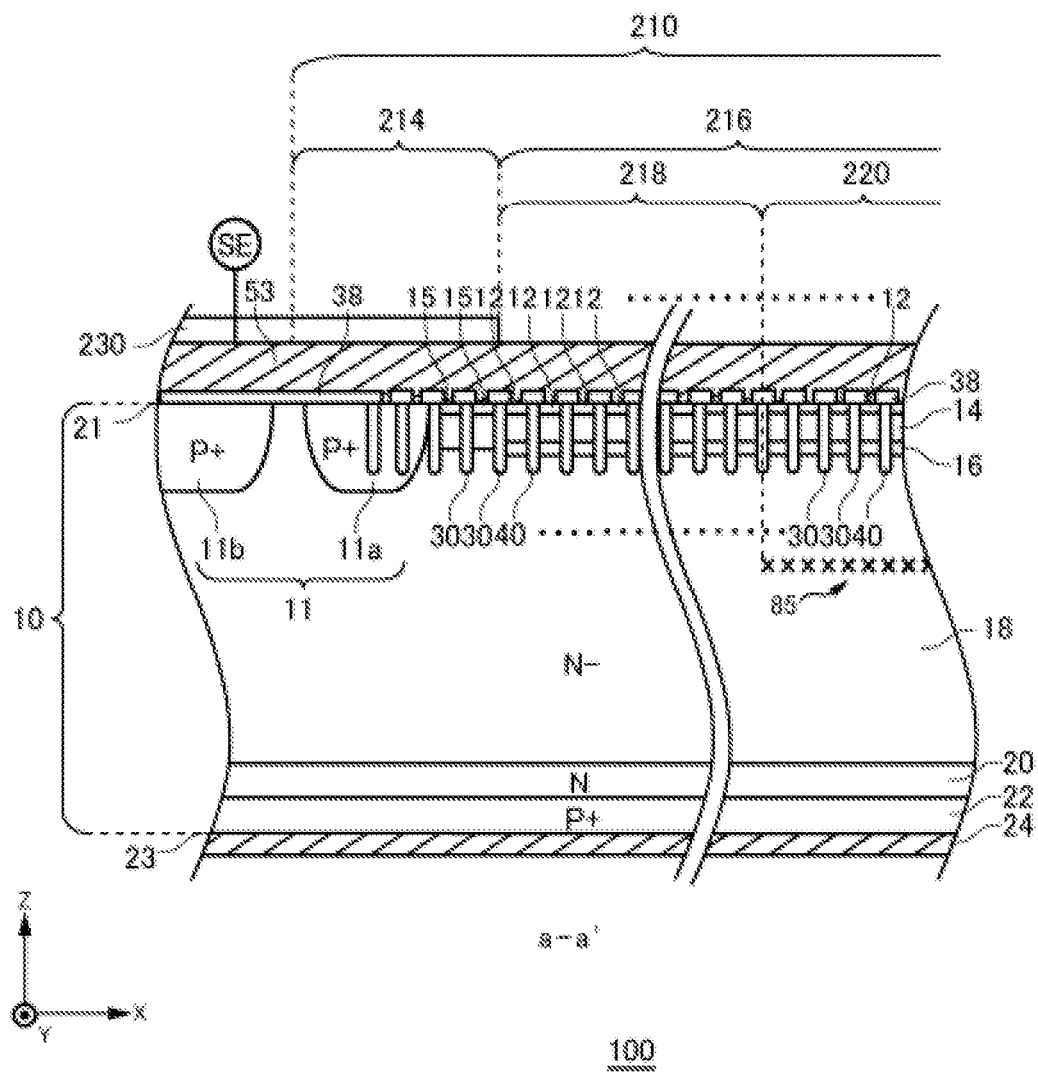
FIG. 3B is a diagram illustrating a cross section a-a' of FIG. 3A.

FIG. 3B is a diagram illustrating a cross section a-a' of FIG. 3A. The cross section a-a' is an XZ plane passing through the emitter region 12 of the current sensing unit 210. The current sensing unit 210 in the present example includes a sense transistor non-irradiation region 218 not provided with the lifetime control region 85 and a sense transistor irradiation region 220 provided with the lifetime control region 85.

In addition, the current sensing emitter electrode 53 is provided above the current sensing unit 210. The current sensing emitter electrode 53 is electrically insulated from the emitter electrode 52 provided above the active region 160.

The trench portion, impurity layer, electrode and the like in the current sensing unit 210 may be provided in the same process as the process for providing the transistor portion 70. In the current sensing unit 210, the lifetime control region 85 may be provided in the same process as the process for providing the lifetime control region 85 in the active region 160.

Note that both the sense transistor non-irradiation region 218 and the sense transistor irradiation region 220 are regions provided with the emitter region 12, and are included in the emitter arrangement region 216. In the example of FIG. 3B, the contact region 15 is provided adjacent to the trench portion in the emitter non-arrangement region 214.

The area ratio between the sense transistor irradiation region 220 and the sense transistor non-irradiation region 218 is equal to the area ratio between the boundary region 75 in the transistor portion 70 and the region other than the boundary region 75.

Thus, in the current sensing unit 210, the threshold voltages can be adjusted by matching the area ratio of the region provided with the lifetime control region 85 to the transistor portion 70.

In the present example, a value G/E obtained by dividing the number (G) of gate trench portions 40 by the number (E) of dummy trench portions 30 included in a unit length in the arrangement direction of each trench portion is called a gate-emitter ratio. The gate-emitter ratio in the current sensing unit 210 is equal to the gate-emitter ratio in the transistor portion 70.

That is, in the current sensing unit 210, the gate trench portion 40 is disposed at the same density as the transistor portion 70. The gate-emitter ratio of the current sensing unit 210 may be calculated from the number of all trench portions arranged in the X axis direction in the current sensing unit 210. The gate-emitter ratio of the transistor portion 70 may also be calculated from the number of all trench portions arranged in the X axis direction in the transistor portion 70.

Figure 3C:
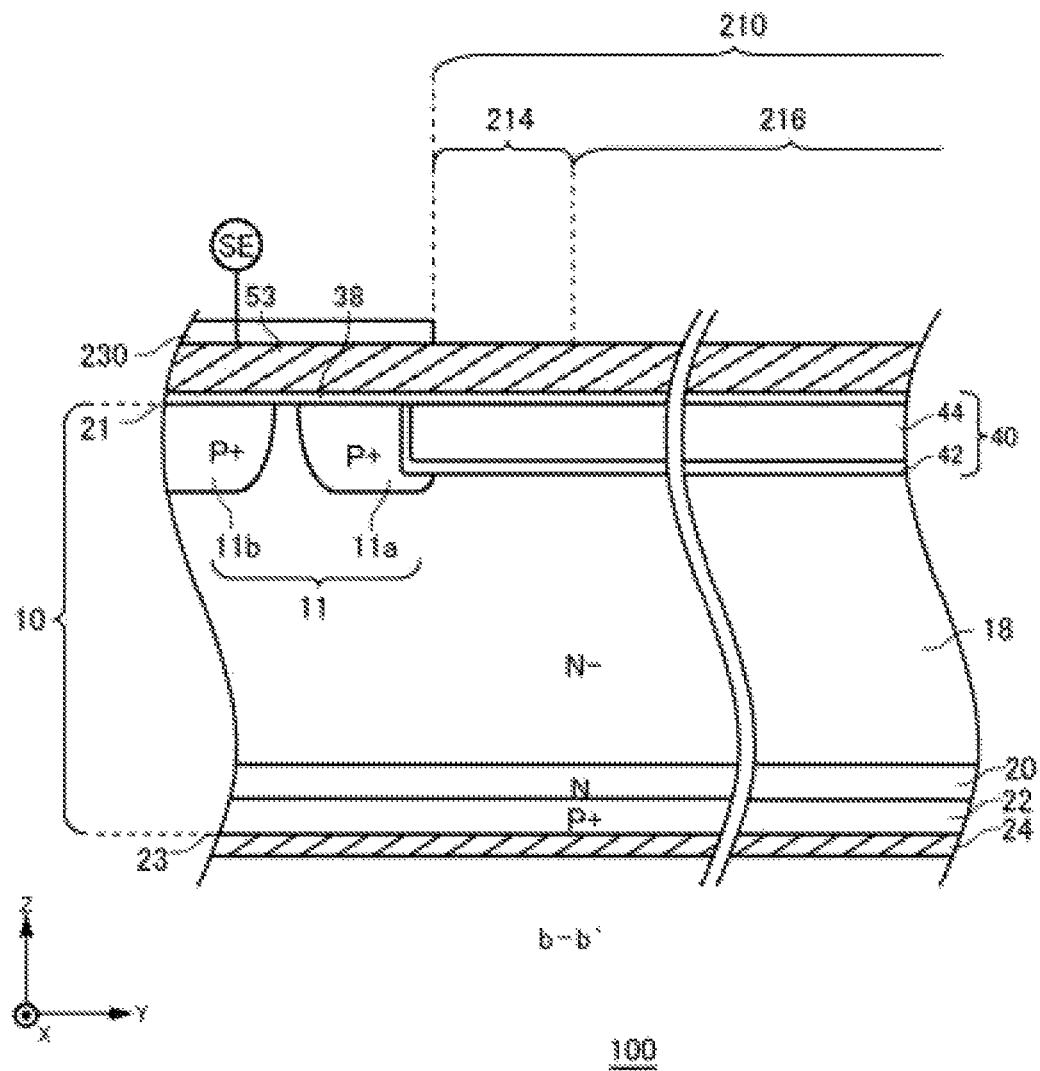
FIG. 3C is a diagram illustrating a cross section b-b' of FIG. 3A.

FIG. 3C is a diagram illustrating a cross section b-b' of FIG. 3A. The cross section b-b' is a cross section in the Y axis direction passing through the gate trench portion 40 of the current sensing unit 210, and shows the negative side of the current sensing unit 210 in the Y axis direction, that is, near the end portion on the edge termination region 190 side.

The current sensing unit 210 of the present example is surrounded by the well region 11. The current sensing unit 210 and the well region 11 are separated by the drift region 18 exposed at the front surface 21. The lower end (end portion on the negative side in the Z axis direction) of the well region 11 is located below the lower end of the gate trench portion 40 (on the negative side in the Z axis direction).

Although not illustrated in FIG. 3C, the end portion of the gate trench portion 40 of the current sensing unit 210 on the positive side (the active region 160 side) in the Y axis direction may be provided at a position overlapping with the gate runner 48. This can consequently make easy connection between the gate trench portion 40 and the gate runner 48.

In the present example, the gate trench portion 40 and the dummy trench portion 30 are illustrated in a stripe shape, but may have a lattice shape. In addition, the gate trench portion 40 and the dummy trench portion 30 may be a combination of the stripe shape and the lattice shape, and can be appropriately changed.

Figure 4A:
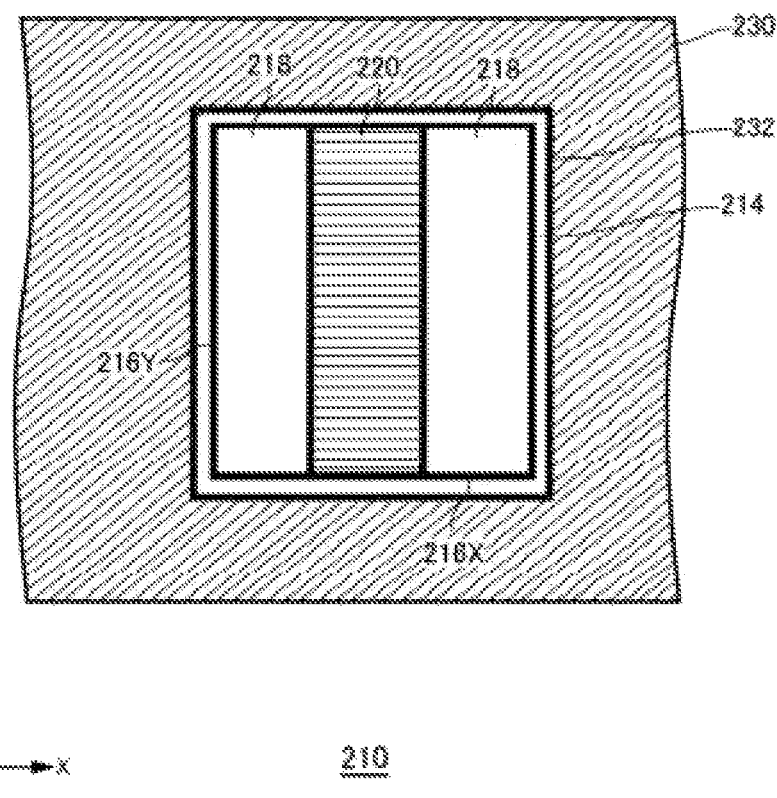
FIG. 4A is a diagram for explaining an example of arrangement of a sense transistor non-irradiation region 218 and a sense transistor irradiation region 220.
Figure 4B:
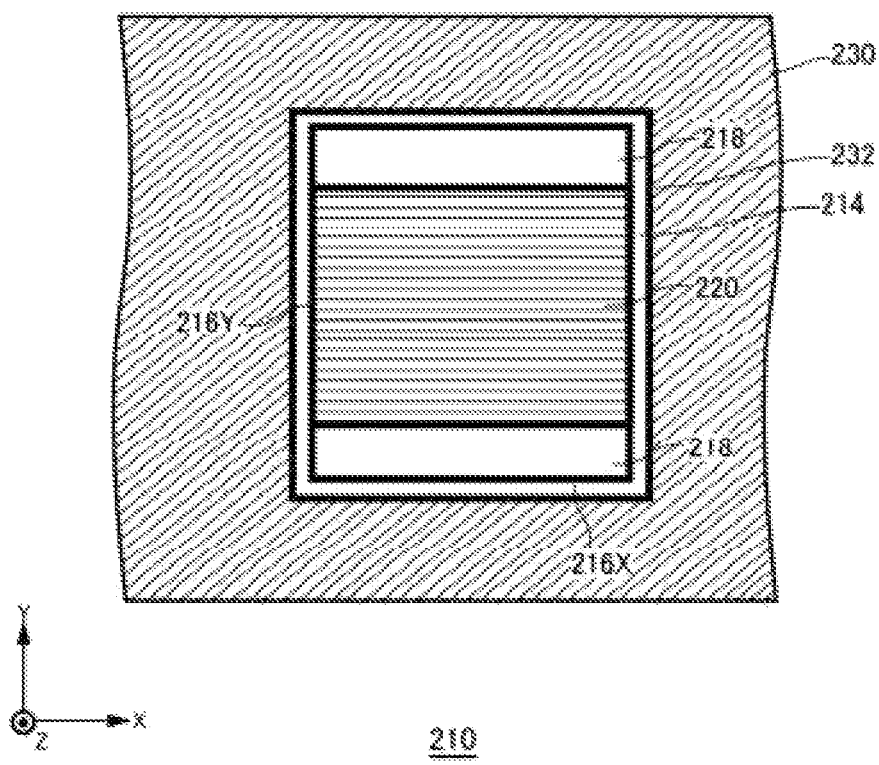
FIG. 4B is a diagram for explaining an example of arrangement of the sense transistor non-irradiation region 218 and the sense transistor irradiation region 220.
Figure 4C:
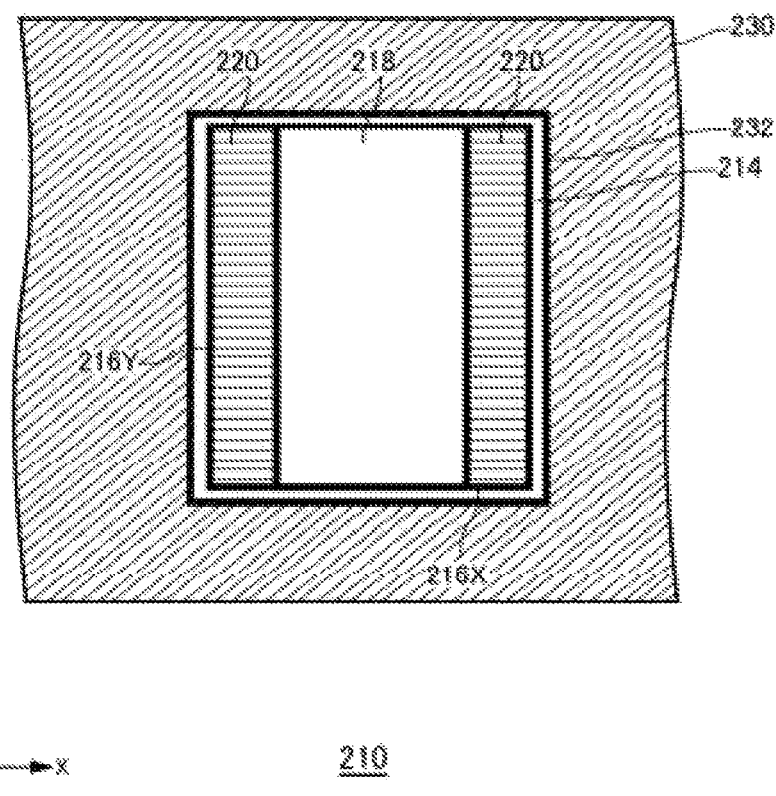
FIG. 4C is a diagram for explaining an example of arrangement of the sense transistor non-irradiation region 218 and the sense transistor irradiation region 220.
Figure 4D:
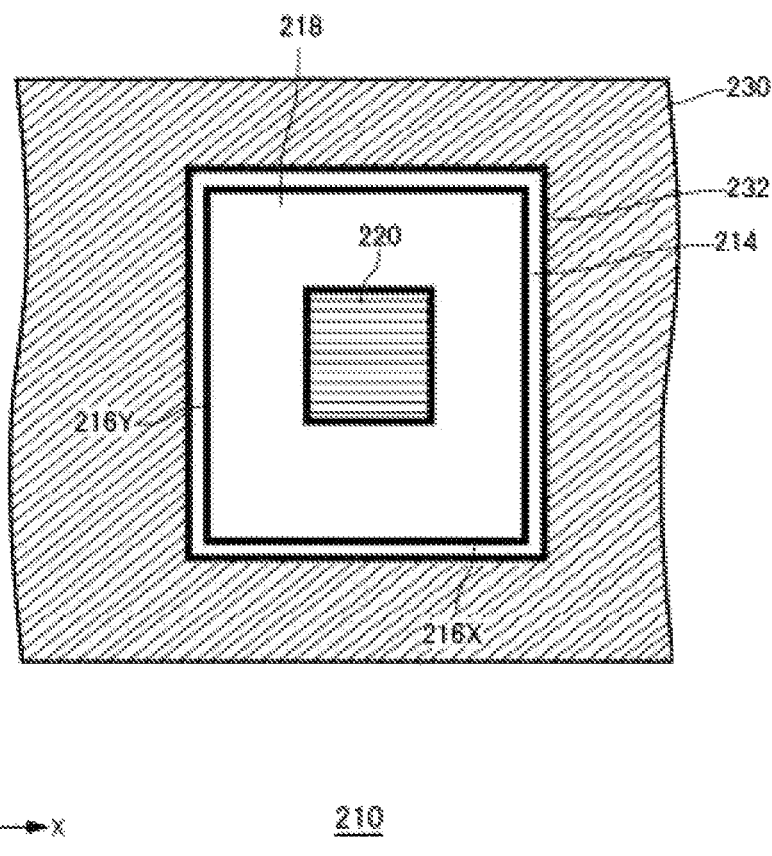
FIG. 4D is a diagram for explaining an example of arrangement of the sense transistor non-irradiation region 218 and the sense transistor irradiation region 220.
Figure 4E:
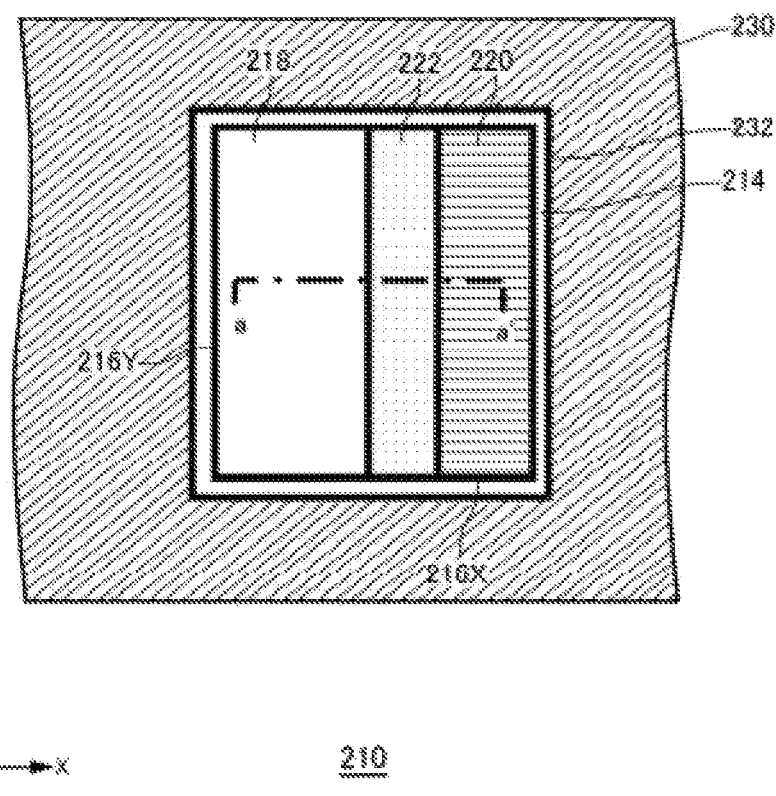
FIG. 4E is a diagram for explaining an example of arrangement of the sense transistor non-irradiation region 218 and the sense transistor irradiation region 220.

FIG. 4A to FIG. 4E are diagrams for explaining examples of arrangement of the sense transistor non-irradiation regions 218 and the sense transistor irradiation regions 220. In FIG. 4A to FIG. 4E, the end portion of the opening 232 of the passivation layer 230 is disposed along the end portion of the emitter non-arrangement region 214 of the current sensing unit 210 in a top view. In the present example, the end portion of the current sensing unit 210 indicates the end portion of the emitter arrangement region 216. In FIG. 4A and FIG. 4E, the region other than the opening 232 in the passivation layer 230 is hatched with oblique lines.

Note that the end portion of the opening 232 of the passivation layer 230 illustrated in FIG. 4A to FIG. 4E may be not disposed along the end portion of the emitter non-arrangement region 214 of the current sensing unit 210 in a top view. The opening 232 of the passivation layer 230 may expose the emitter arrangement region 216, the well regions 11a and 11b, or the drift region 18 in a top view.

In FIG. 4A to FIG. 4E, the emitter non-arrangement region 214 is provided on the outer periphery of the emitter arrangement region 216. The end portion of the opening 232 of the passivation layer 230 may be disposed along the end portion of the emitter arrangement region 216 of the current sensing unit 210 in a top view.

The emitter arrangement region 216 includes a pair of facing end portions 216X extending in the X axis direction, and a pair of facing end portions 216Y extending in the Y axis direction. In the example of FIG. 4A, the current sensing unit 210 includes the sense transistor non-irradiation region 218 extending along one of the end portions 216Y, the sense transistor non-irradiation region 218 extending along the other end portion 216Y, and the sense transistor irradiation region 220 extending in the Y axis direction between these sense transistor non-irradiation regions 218.

In the example of FIG. 4B, the current sensing unit 210 includes the sense transistor non-irradiation region 218 extending along one of the end portions 216X, the sense transistor non-irradiation region 218 extending along the other end portion 216X, and the sense transistor irradiation region 220 extending in the X axis direction between these sense transistor non-irradiation regions 218.

In this way, the sense transistor irradiation region 220 is disposed to be extended in the X axis or Y axis direction between the sense transistor non-irradiation regions 218, so that the area occupied by the sense transistor irradiation region 220 in the current sensing unit 210 does not change even when the position of the opening of the resist mask used for irradiation is shifted in the X axis or Y axis direction and thus the position of the sense transistor irradiation region 220 is shifted. Thus, the area ratio of the region provided with the lifetime control region 85 can be easily adjusted to the transistor portion 70 in the current sensing unit 210.

In the example of FIG. 4C, the current sensing unit 210 includes the sense transistor irradiation region 220 extending along one of the end portions 216Y, the sense transistor irradiation region 220 extending along the other end portion 216Y, and the sense transistor non-irradiation region 218 extending in the Y axis direction between these sense transistor irradiation regions 220.

That is, FIG. 4C illustrates an example in which the sense transistor non-irradiation region 218 and the sense transistor irradiation region 220 are replaced in the example of FIG. 4A. Similarly, in the example of FIG. 4B, the sense transistor non-irradiation region 218 and the sense transistor irradiation region 220 may be replaced. Even in such a case, the area ratio of the region provided with the lifetime control region 85 can be easily adjusted to the transistor portion 70 in the current sensing unit 210.

In the example of FIG. 4D, the current sensing unit 210 includes the sense transistor non-irradiation region 218 disposed along the end portions 216X and 216Y, and the sense transistor irradiation region 220 surrounded by the sense transistor non-irradiation region 218.

In this way, the sense transistor irradiation region 220 is disposed to be surrounded by the sense transistor non-irradiation regions 218, so that the area occupied by the sense transistor irradiation region 220 in the current sensing unit 210 does not change even when the position of the opening of the resist mask used for irradiation is shifted in the X axis or Y axis direction and thus the position of the sense transistor irradiation region 220 is shifted. Thus, the area ratio of the region provided with the lifetime control region 85 can be easily adjusted to the transistor portion 70 in the current sensing unit 210.

In the examples illustrated in FIG. 4A to FIG. 4D, the deviation of the irradiation region can be absorbed by the emitter non-arrangement region 214 even when the position of the opening of the resist mask used for irradiation is shifted in the X axis or Y axis direction.

In the example of FIG. 4E, the current sensing unit 210 further includes an invalid region 222 between the sense transistor non-irradiation region 218 and the sense transistor irradiation region 220.

The invalid region 222 is a region provided between the sense transistor non-irradiation region 218 and the region provided with the sense transistor irradiation region 220. When the position of the opening of the resist mask used for irradiation is shifted and the position of the sense transistor irradiation region 220 is shifted, the invalid region 222 reduces the influence on the change of threshold voltage.

In the invalid region 222, a plurality of trench portions is provided on the front surface 21 side of the semiconductor substrate 10 similar to the sense transistor non-irradiation region 218 and the sense transistor irradiation region 220. The trench portion provided in the invalid region 222 may be electrically connected to the current sensing emitter electrode 53.

Alternatively, the upper surface of the mesa portion between the plurality of trench portions provided in the invalid region 222 may be not in contact with the current sensing emitter electrode 53. That is, the upper surface of the mesa portion in the invalid region 222 may be covered with the interlayer dielectric film 38.

Alternatively, an emitter region 12 may not be provided in the invalid region 222. For example, the invalid region 222 includes the well region 11a provided in the front surface 21 of the semiconductor substrate 10. Since no channel is formed in the invalid region 222, the lowering of the threshold voltage is not affected even if the lifetime control region 85 is formed.

Note that, in the example of FIG. 4E, the sense transistor non-irradiation region 218, the sense transistor irradiation region 220, and the invalid region 222 are all provided to extend in the Y axis direction, but the invention is not limited to this. The invalid region 222 may be provided so as to separate the sense transistor non-irradiation region 218 and the sense transistor irradiation region 220.

In addition, in the example of FIG. 4E, the sense transistor non-irradiation region 218 and the sense transistor irradiation region 220 each are provided to extend along their respective end portions 216Y, but the invention is not limited to them. The sense transistor non-irradiation region 218 and the sense transistor irradiation region 220 may be disposed as illustrated in FIG. 4A to FIG. 4D.

Figure 4F:
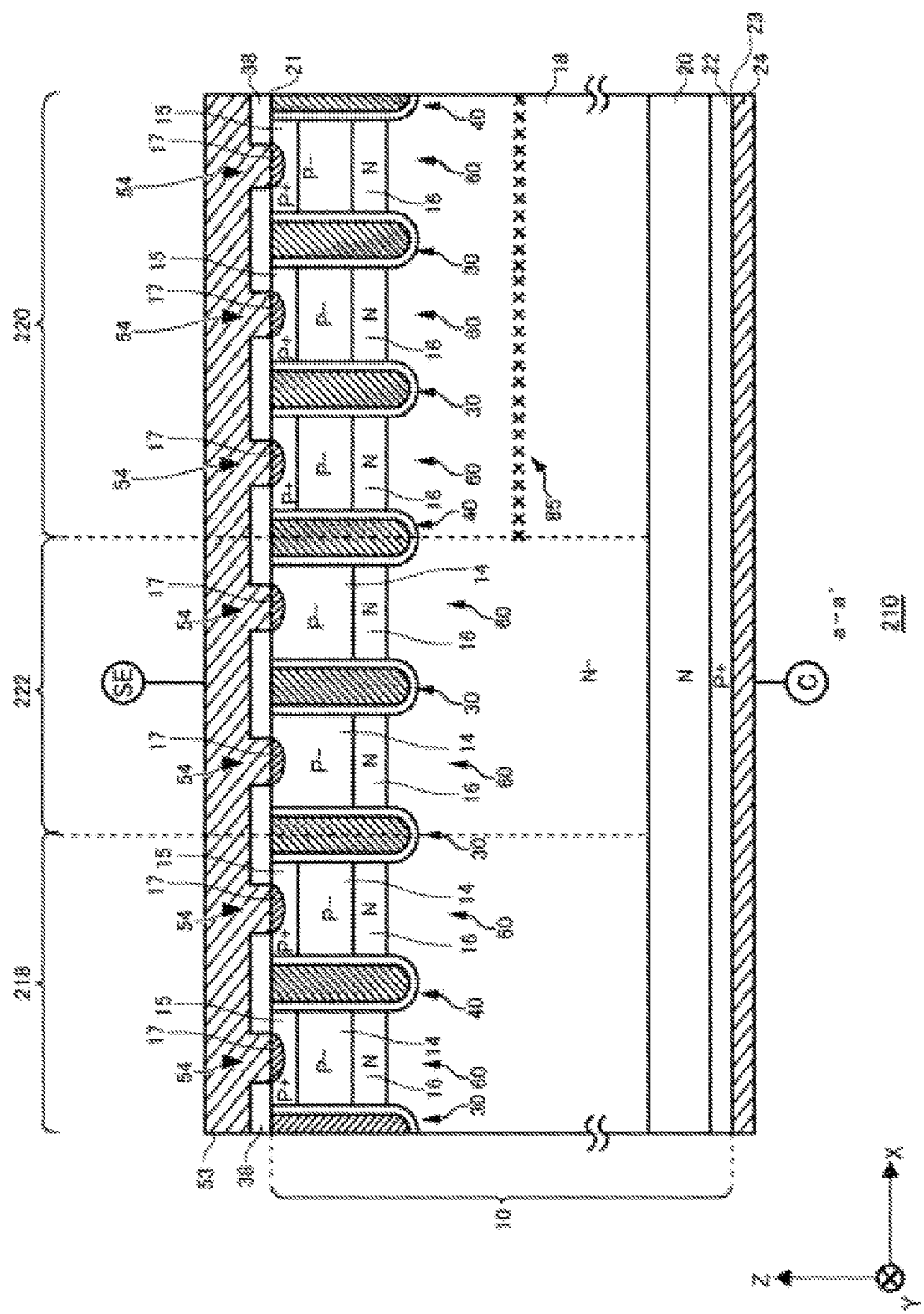
FIG. 4F is a diagram illustrating an example of a cross section a-a' of FIG. 4E.
Figures 1, 4F:
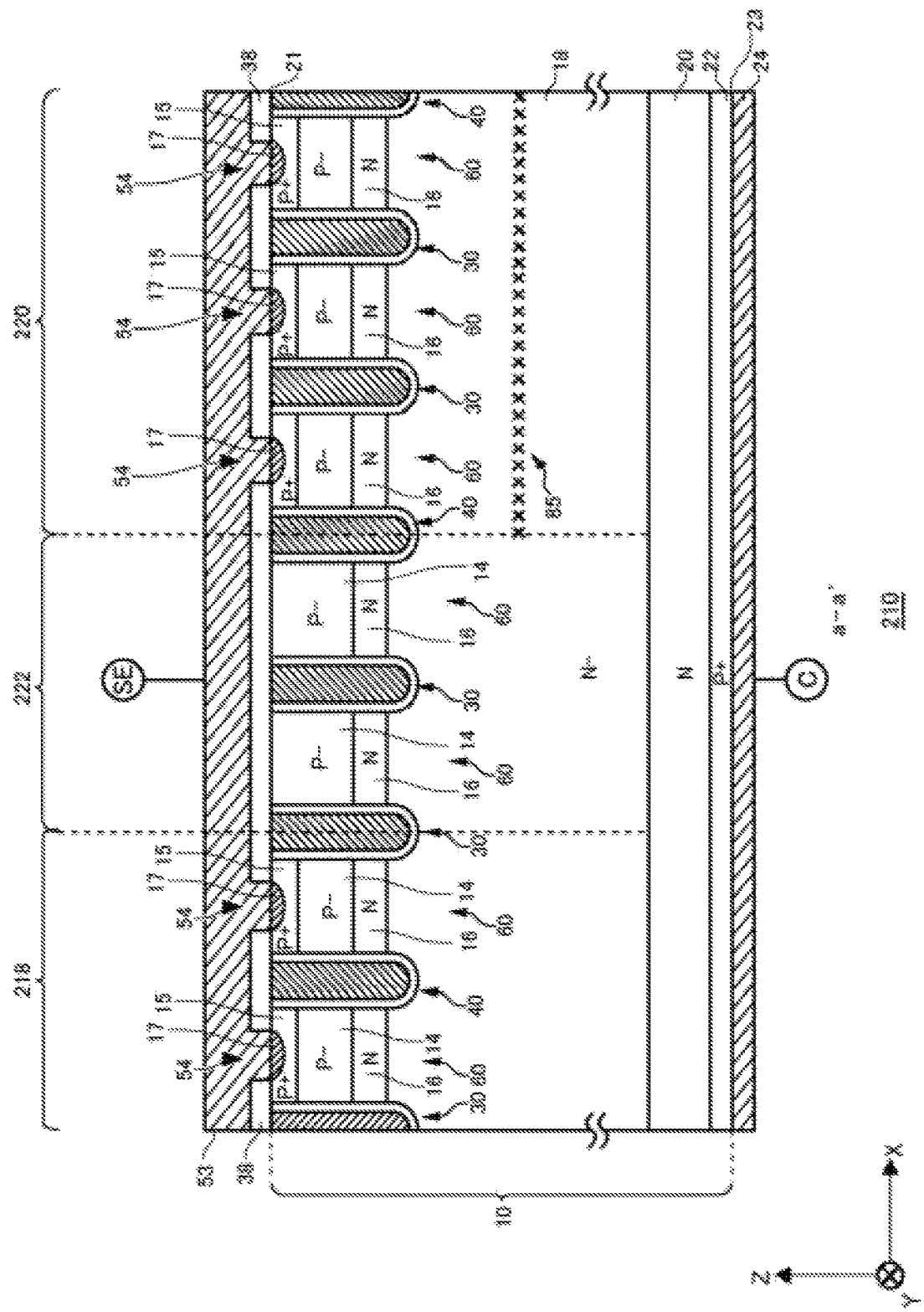

FIG. 4F is a diagram illustrating an example of a cross section a-a' in FIG. 4E. In FIG. 4F, the emitter region 12 is not provided in the invalid region 222, and the trench portion is electrically connected to the current sensing emitter electrode 53.

Here, when the position of the opening of the resist mask used for irradiation is shifted to the negative side in the X axis direction, the lifetime control region 85 is also formed in the invalid region 222. However, since no channel is formed in the invalid region 222, the lifetime control region 85 formed in the invalid region 222 does not affect the threshold value. That is, since the invalid region 222 does not operate as a transistor, even if the lifetime control region 85 is formed in the invalid region 222, the position (in FIG. 4F, the position in the X axis direction) of the end portion of the sense transistor irradiation region 220 on the invalid region 222 side does not change.

FIG. 4F-1 is a diagram illustrating an example of the cross section a-a' in FIG. 4E. In FIG. 4F-1, the contact hole 54 is not formed in the interlayer dielectric film 38 of the invalid region 222. The trench portion of the invalid region 222 may be the dummy trench portion 30, and the trench portion may be electrically connected to the current sensing emitter electrode 53. In addition, the emitter region 12 and the plug region 17 may not be provided in the invalid region 222.

Figures 2, 4F:
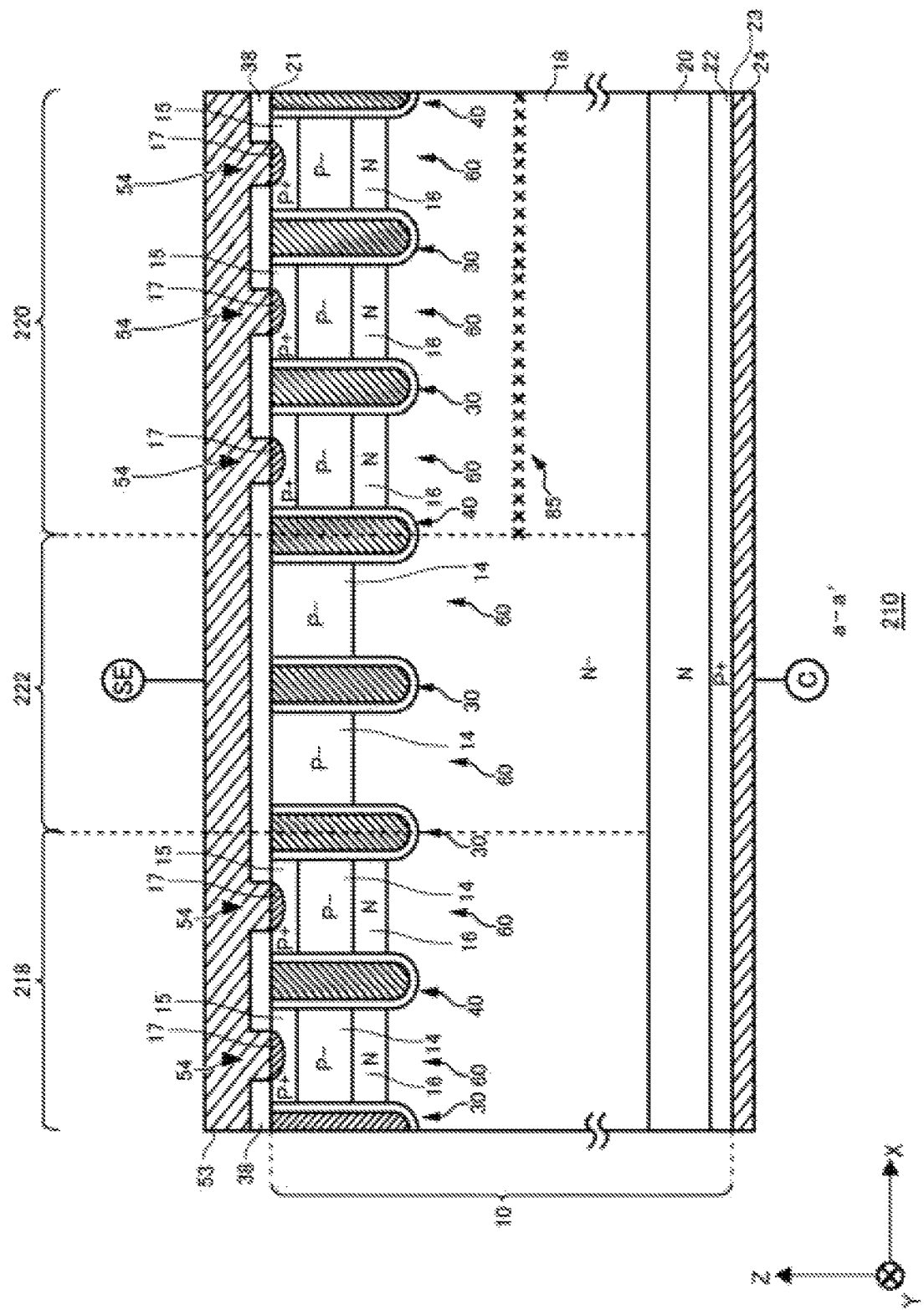
Figures 3, 4F:
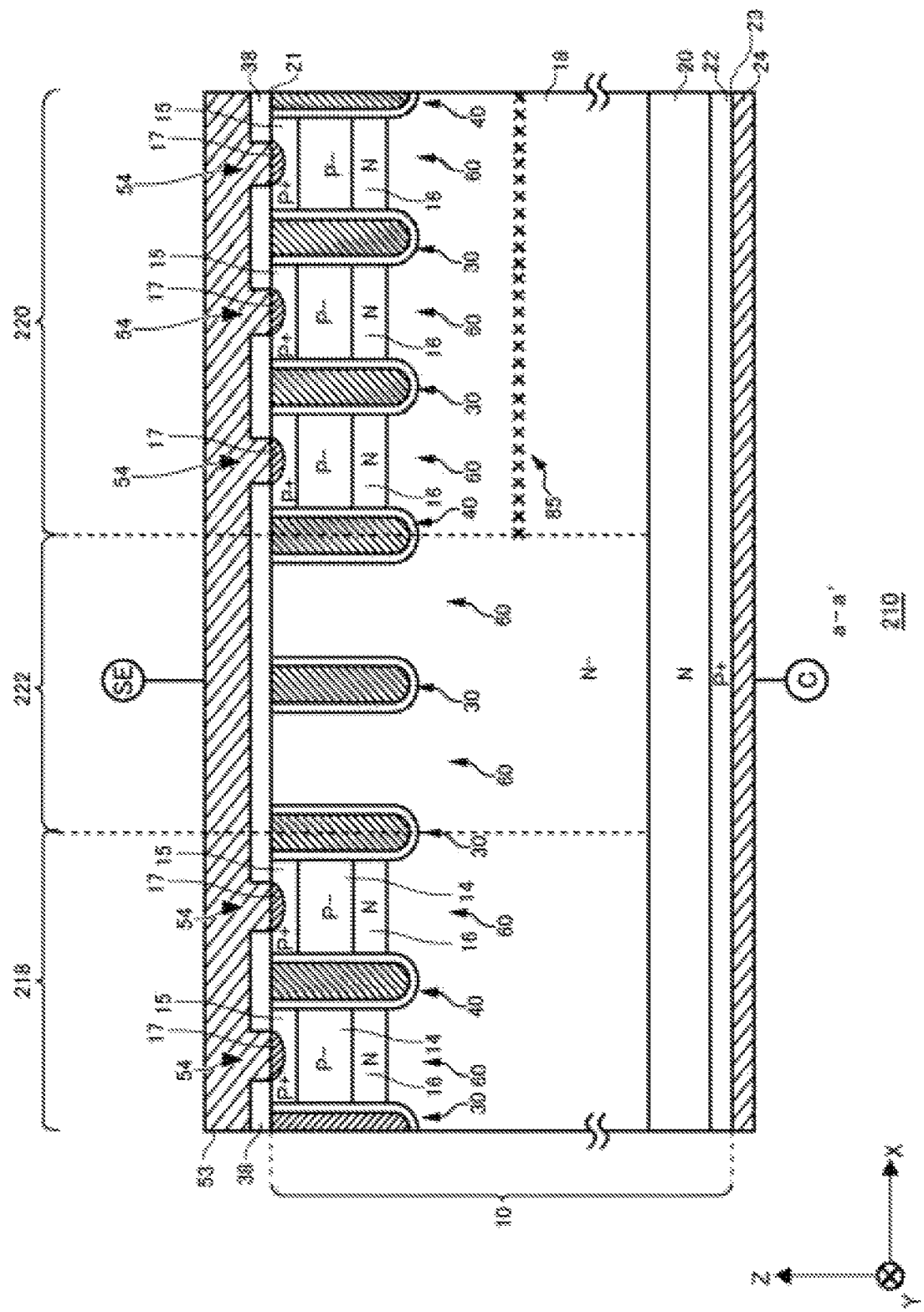

FIG. 4F-2 is a diagram illustrating an example of the cross section a-a' in FIG. 4E. The example in FIG. 4F-2 differs from that of FIG. 4F-1 in that the accumulation region 16 is not provided in the invalid region 222. FIG. 4F-3 a diagram illustrating an example of the cross section a-a' in FIG. 4E. The example in FIG. 4F-3 differs from that of FIG. 4F-2 in that the base region 14 is not provided in the invalid region 222. According to the examples of FIG. 4F-1, FIG. 4F-2, and FIG. 4F-3, the same effect as the example in FIG. 4F can be obtained.

Figures 4, 4F:
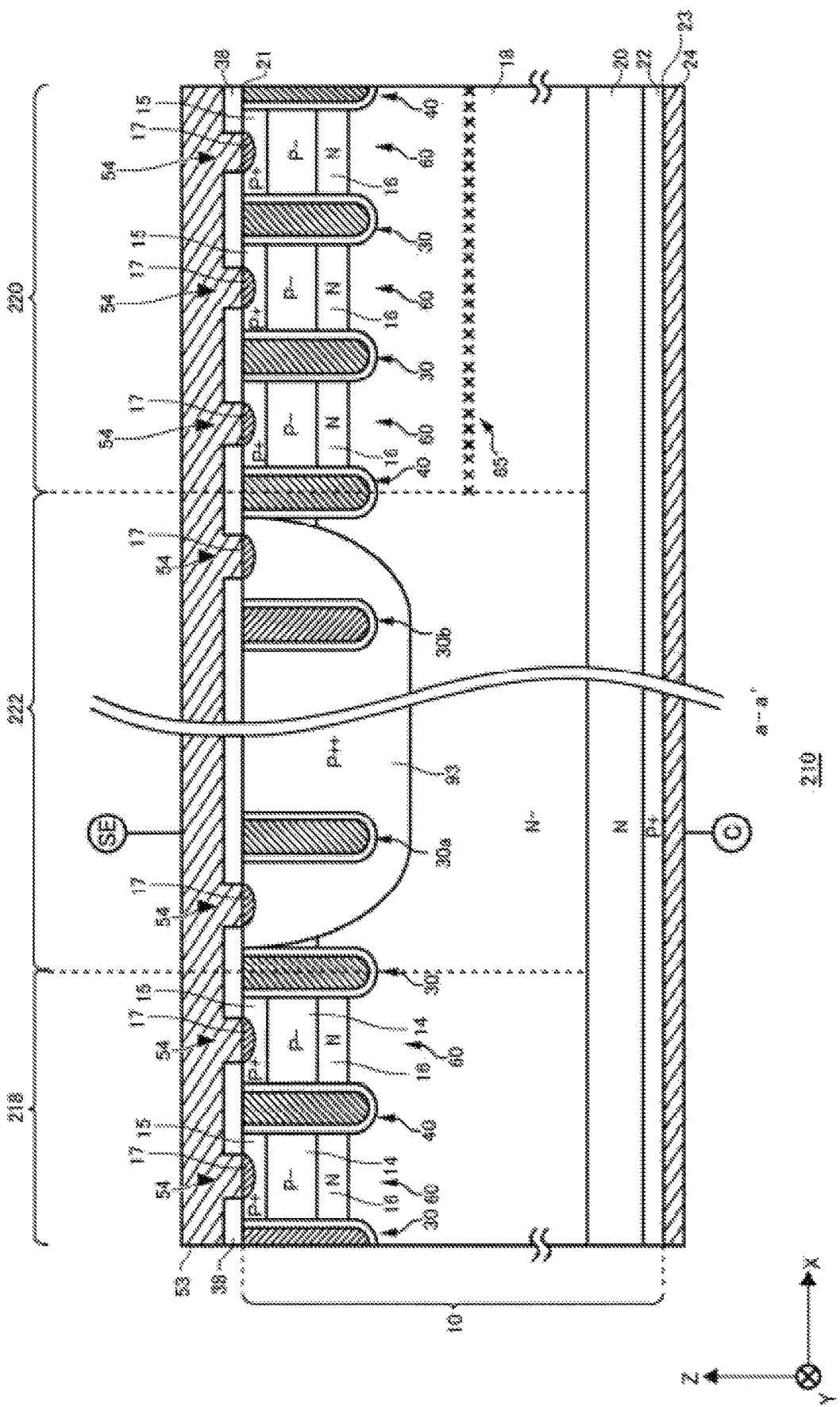

FIG. 4F-4 is a diagram illustrating an example of the cross section a-a' in FIG. 4E. In the example of FIG. 4F-4, a separation region 93 is provided on the front surface 21 side of the semiconductor substrate 10 in the invalid region 222. In the X axis direction of FIG. 4F-4, the contact hole 54 and a dummy trench portion 30a may be provided on the sense transistor non-irradiation region 218 side of the separation region 93. The plug region 17 is provided in the surface layer of the separation region 93 exposed through the contact hole 54. Note that the contact hole 54 and the plug region 17 of the invalid region 222 may not be provided.

In addition, in the X axis direction of FIG. 4F-4, the contact hole 54 and a dummy trench portion 30b may also be provided on the sense transistor irradiation region 220 side of the separation region 93. A trench portion may not be provided between the dummy trench portion 30a and the dummy trench portion 30b.

The separation region 93 is a P type. The doping concentration of the separation region 93 may be the same as the doping concentration of the contact region 15, may be the same as the doping concentration of the plug region 17, or may be the same as the doping concentration of the well region 11. In addition, the separation region 93 may be electrically connected to the well region 11a. The lower surface of the separation region 93 may be shallower, equal, or deeper than the lower end of the trench portion, or may be at the same position as the lower surface of the well region 11 in the depth direction. In the example of FIG. 4F-4, the same effect as the example of FIG. 4F can be obtained.

Figure 4G:
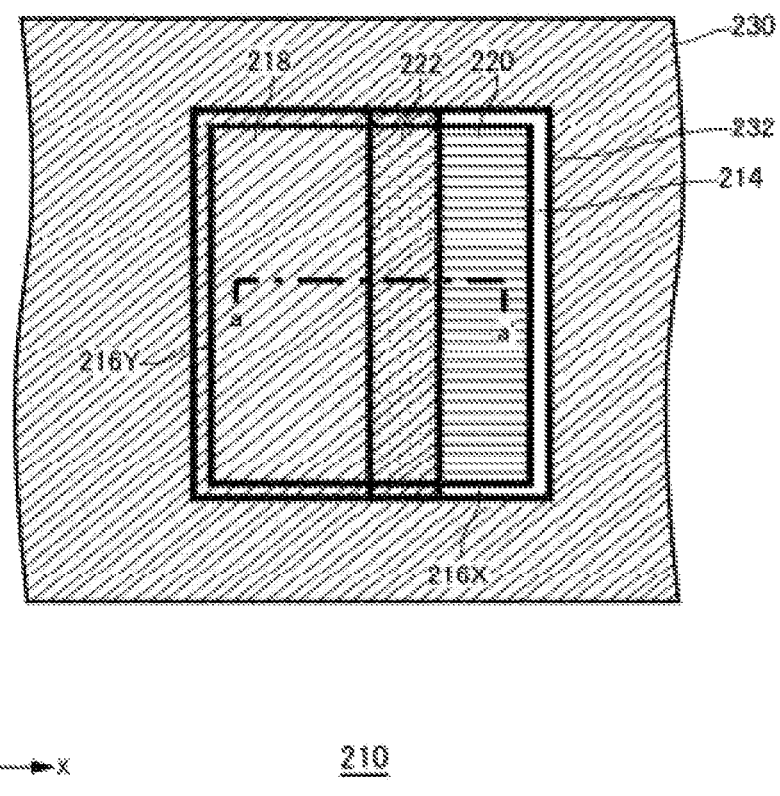
FIG. 4G is a diagram for explaining an example of arrangement of the sense transistor non-irradiation region 218 and the sense transistor irradiation region 220.

FIG. 4G is a diagram for explaining an example of arrangement of the sense transistor non-irradiation region 218 and the sense transistor irradiation region 220. The arrangement of the sense transistor non-irradiation region 218 and the sense transistor irradiation region 220 illustrated in FIG. 4G is the same as the example of FIG. 4E. In FIG. 4G, the end portion of the opening 232 of the passivation layer 230 is disposed so as to overlap the end portion of the emitter non-arrangement region 214 provided on the outer periphery of the sense transistor irradiation region 220 in the X axis direction. In addition, the end portion of the opening 232 of the passivation layer 230 is disposed so as to overlap the end portion of the emitter non-arrangement region 214 provided on the outer periphery of the sense transistor irradiation region 220 in the Y axis direction. Further, the end portion of the opening 232 is disposed so as to overlap the boundary between the invalid region 222 and the sense transistor irradiation region 220.

Figure 4H:
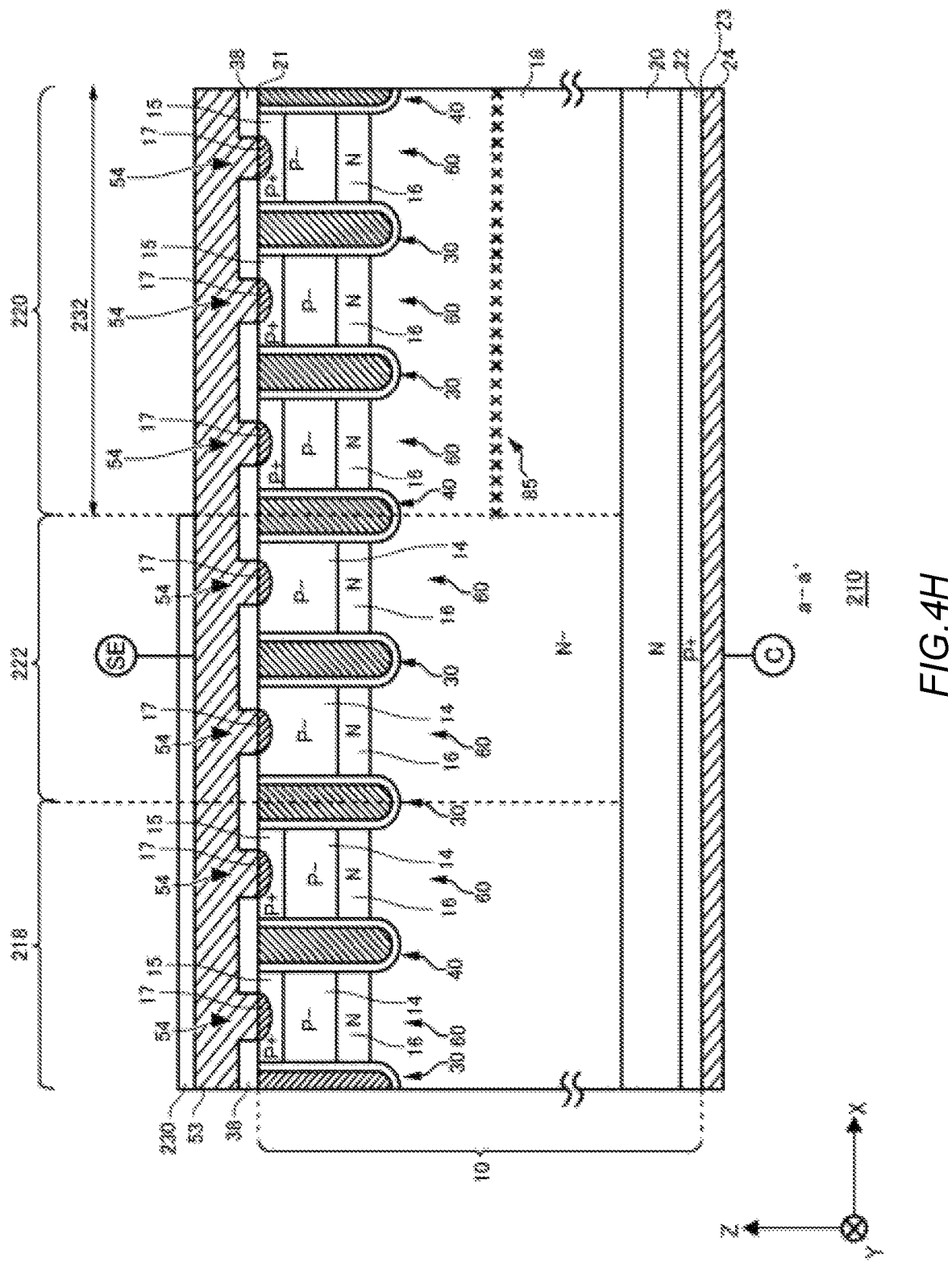
FIG. 4H is a diagram illustrating a cross section a-a' of FIG. 4G.

FIG. 4H is a diagram illustrating a cross section a-a' of FIG. 4G. As illustrated in FIG. 4H, the end portion of the opening 232 of the passivation layer 230 and the end portion of the sense transistor irradiation region 220 are at the same position (in FIG. 4H, the position in the X axis direction). That is, the opening 232 of the passivation layer 230 and the opening of the resist mask are disposed so as to overlap each other in a top view.

Here, when the position of the opening of the resist mask is shifted to the negative side in the X axis direction with respect to the opening 232 of the passivation layer 230, a part of helium or proton irradiated through the opening of the resist mask passes through the passivation layer 230. Since helium or proton passing through the passivation layer 230 decreases in range as compared with the case of passing through the opening 232, the lifetime control region 85 is formed at a position near the front surface 21 of the semiconductor substrate 10 below the passivation layer 230 as compared with the lower part of the opening 232. In FIG. 4G, since the lower part of the passivation layer 230 is the invalid region 222, the change of threshold voltage is not affected as described above even if the lifetime control region 85 is formed.

Alternatively, the opening 232 of the passivation layer 230 may be disposed so as to cover the entire sense transistor irradiation region 220. In this case, a part of the invalid region 222 is located below the opening 232 in addition to the sense transistor irradiation region 220. As described above, even if the lifetime control region 85 is formed in the invalid region 222, the change of threshold voltage is not affected.

In the present example, an example in which the emitter region 12 is not provided in the invalid region 222 and the trench portion is electrically connected to the current sensing emitter electrode 53 has been described, but the same effect can also be obtained in the examples of FIG. 4F-1 to FIG. 4F-4.

Figure 5A:
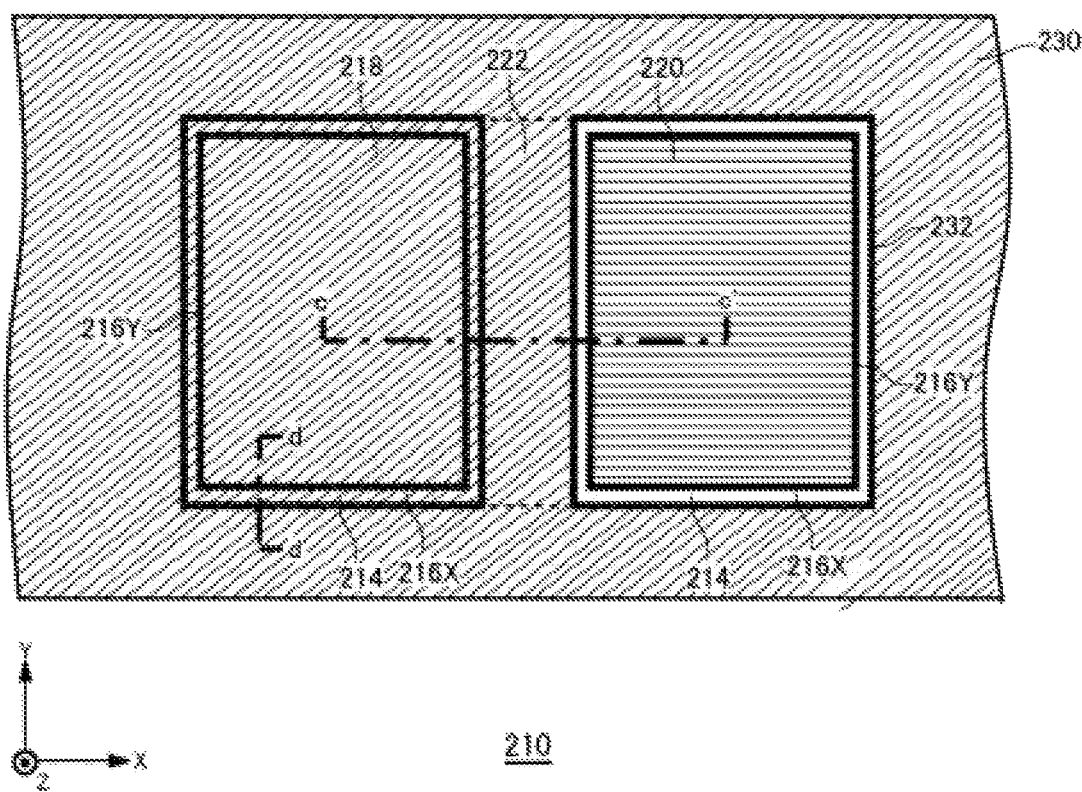
FIG. 5A is a diagram for explaining an example of arrangement of the sense transistor non-irradiation region 218 and the sense transistor irradiation region 220.

FIG. 5A is a diagram for explaining an example of arrangement of the sense transistor non-irradiation region 218 and the sense transistor irradiation region 220. In the present example, the invalid region 222 is provided between the sense transistor non-irradiation region 218 and the sense transistor irradiation region 220. The outermost peripheries of the sense transistor non-irradiation region 218 and the sense transistor irradiation region 220 include separate emitter non-arrangement regions 214.

The example in FIG. 5A differs from the example of FIG. 4A in that the sense transistor non-irradiation region 218 and the sense transistor irradiation region 220 are provided individually with the invalid region 222 sandwiched therebetween. The end portion of the opening 232 of the passivation layer 230 is disposed along the end portion of the emitter non-arrangement region 214 of the sense transistor irradiation region 220 in a top view. The opening 232 of the passivation layer 230 may be disposed so as to cover the entire sense transistor irradiation region 220.

Figure 5B:
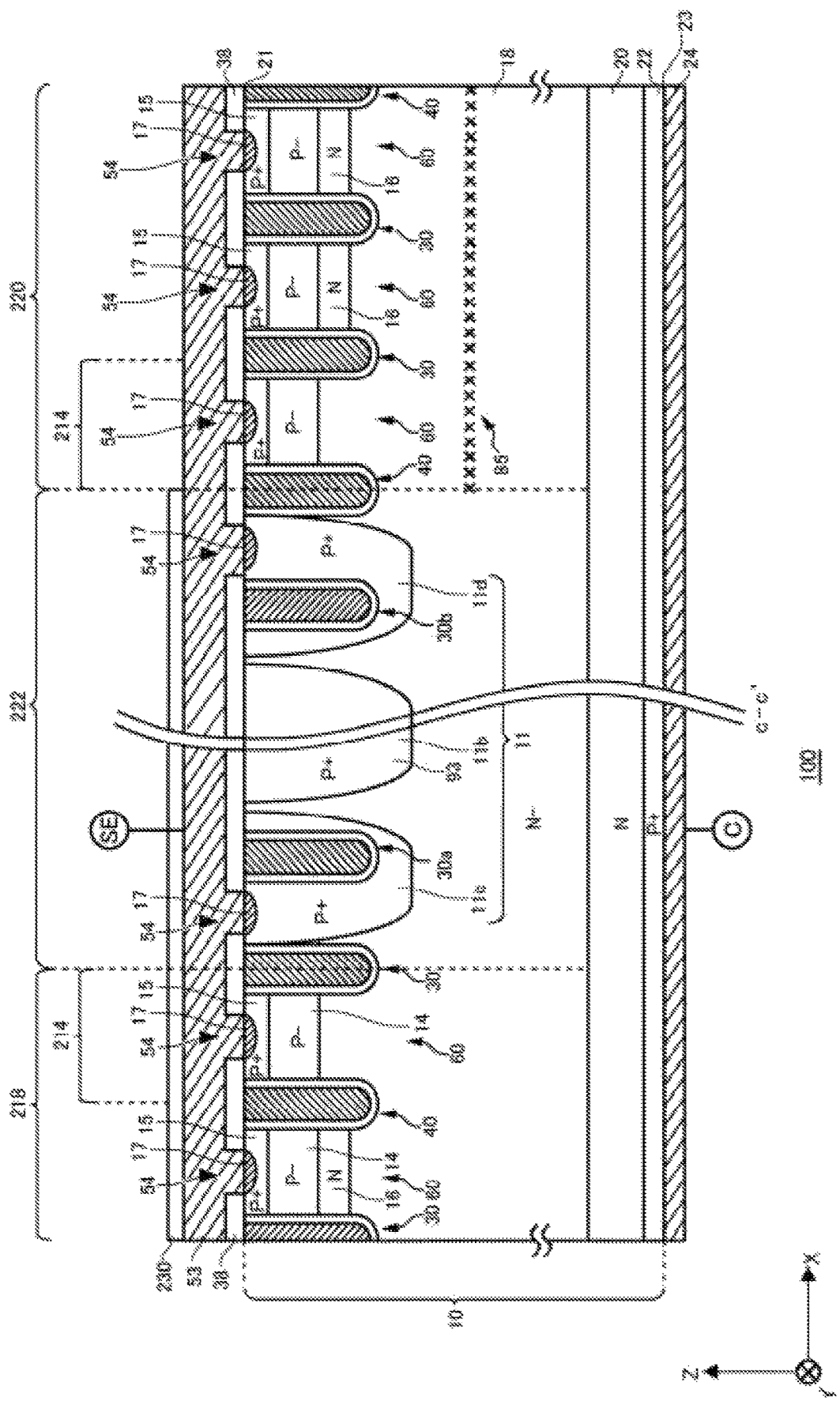
FIG. 5B is a diagram illustrating a cross section c-c' of FIG. 5A.

FIG. 5B is a diagram illustrating a cross section c-c' of FIG. 5A. As illustrated in FIG. 5B, a well region 11c is provided on the outer periphery of the sense transistor non-irradiation region 218, and a well region 11d is provided on the outer periphery of the sense transistor irradiation region 220. The well region 11b is provided between the adjacent well regions 11c and 11d. The well region 11b, the well region 11c, and the well region 11d are separated by the drift region 18.

Note that the end portion of the opening 232 of the passivation layer 230 and the end portion of the sense transistor irradiation region 220 are at the same position (in FIG. 5B, the position in the X axis direction). That is, the opening 232 of the passivation layer 230 and the opening of the resist mask used for irradiation are disposed so as to overlap in a top view.

The well region 11c provided on the outer periphery of the sense transistor non-irradiation region 218 includes the dummy trench portion 30a. The interlayer dielectric film 38 is provided in the upper surface of the well region 11c provided on the outer periphery of the sense transistor non-irradiation region 218. The contact hole 54 may be provided in the interlayer dielectric film 38, and the plug region 17 may be provided in the surface layer of the well region 11c where the contact hole 54 is opened. The well region 11c may include the contact hole 54 on the sense transistor non-irradiation region 218 side, and the dummy trench portion 30a on the well region 11b side.

The well region 11d provided on the outer periphery of the sense transistor irradiation region 220 includes the dummy trench portion 30b. The interlayer dielectric film 38 is provided in the upper surface of the well region 11d provided on the outer periphery of the sense transistor irradiation region 220. The contact hole 54 may be provided in the interlayer dielectric film 38, and the plug region 17 may be provided in the surface layer of the well region 11d where the contact hole 54 is opened. The well region 11d may include the contact hole 54 on the sense transistor irradiation region 220 side, and the dummy trench portion 30b on the well region 11b side.

The invalid region 222 is provided with the well region 11b, the well region 11c, and the well region 11d. In addition, the invalid region 222 includes the drift region 18 which separates the well regions 11b, 11c, and 11d.

Figure 5C:
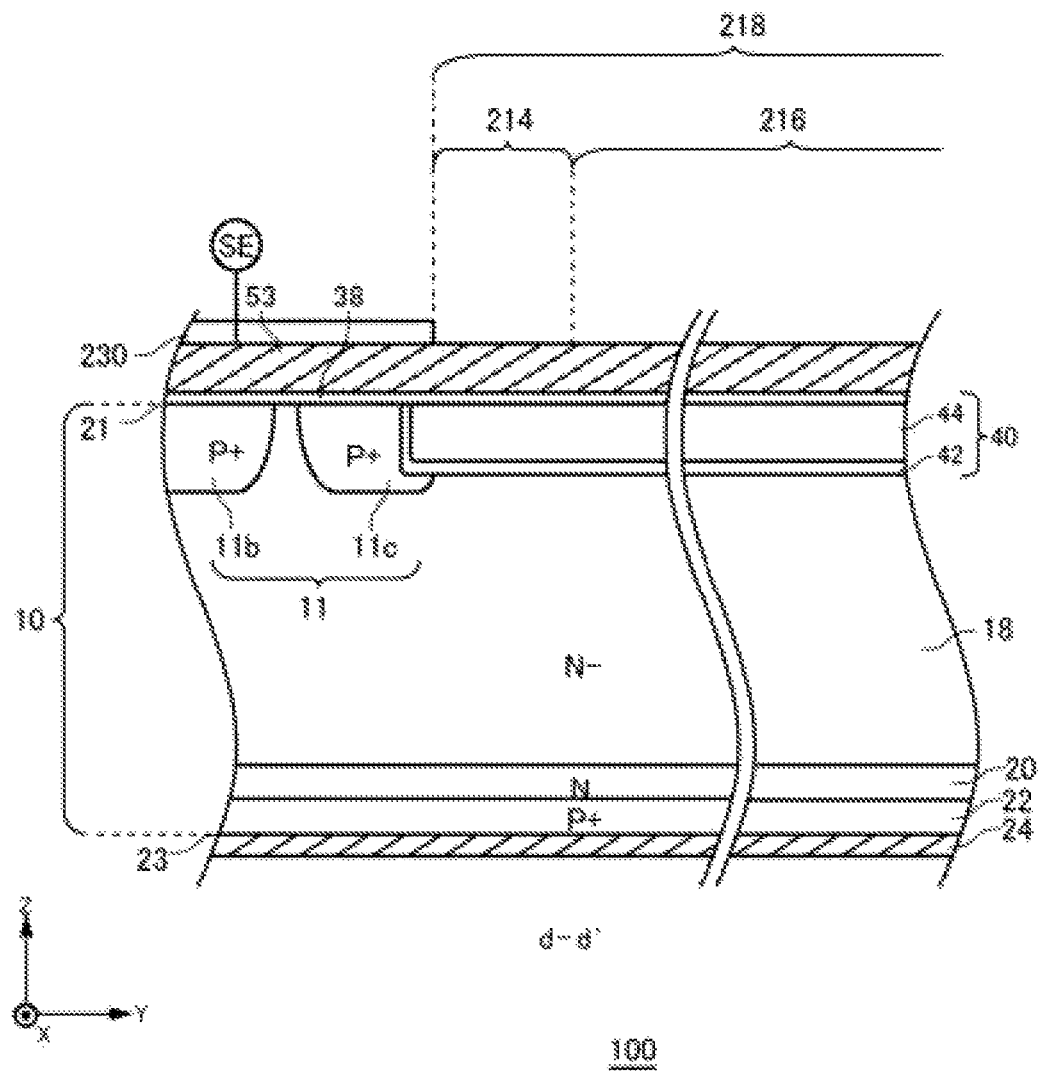
FIG. 5C is a diagram illustrating a cross section d-d' of FIG. 5A.

FIG. 5C is a diagram illustrating a cross section d-d' of FIG. 5A. The cross section d-d' is a cross section in the Y axis direction passing through the gate trench portion 40 of the sense transistor non-irradiation region 218, and shows the negative side of the sense transistor non-irradiation region 218 in the Y axis direction, that is, near the end portion on the edge termination region 190 side.

The sense transistor non-irradiation region 218 of the present example is surrounded by the well region 11c. The sense transistor non-irradiation region 218 and the well region 11c are separated by the drift region 18 exposed at the front surface 21. The lower end (end portion on the negative side in the Z axis direction) of the well region 11c is located below (the negative side in the Z axis direction) the lower end of the gate trench portion 40.

Although not illustrated in FIG. 5C, the dummy trench portion 30 also has a similar cross-sectional shape. In addition, the sense transistor irradiation region 220 also has a similar cross section. The sense transistor irradiation region 220 differs from FIG. 5C in that the gate trench portion 40 and the dummy trench portion 30 are surrounded by the well region 11d, and the lifetime control region 85 is provided in the lower part of the gate trench portion 40 and the dummy trench portion 30.

Note that the gate trench portion 40 and the dummy trench portion 30 of FIG. 5C are illustrated in a stripe shape, but may have a lattice shape. In addition, the shape may be a combination of the stripe shape and the lattice shape, and can be changed appropriately. The same effect as FIG. 4E can also be obtained in the present example.

Figure 6A:
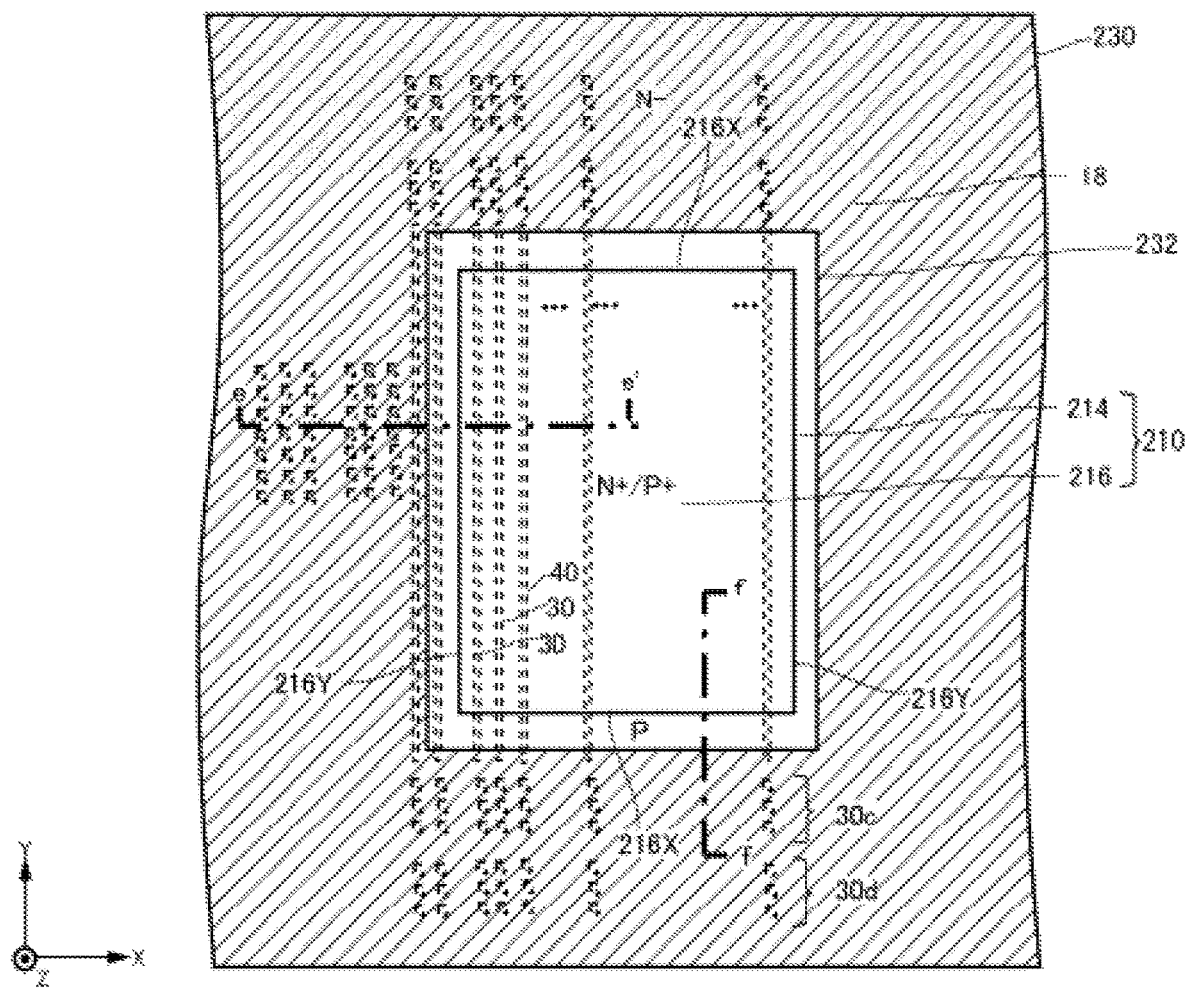
FIG. 6A is an enlarged top view near the current sensing unit 210.

FIG. 6A is an enlarged top view of the vicinity of the current sensing unit 210. The current sensing unit 210 of the present example is surrounded by a region in which dummy trench portions 30c are arranged and a region in which dummy trench portions 30d are arranged. The region in which the drift region 18 is exposed at the front surface 21 is formed between the region in which the dummy trench portions 30c are arranged and the region in which the dummy trench portions 30d are arranged. The dummy trench portion 30c is connected to the same potential as the current sensing emitter electrode 53, and the dummy trench portion 30d is connected to the same potential as the emitter electrode 52.

In the present example, the opening 232 of the passivation layer 230 is provided so as to overlap the current sensing unit 210. In addition, the configuration in the present example differs from the configuration in FIG. 3A in that the current sensing unit 210 is separated from the active region 160 by the regions in which the dummy trench portions 30c and the dummy trench portions 30d are arranged.

In FIG. 6A, the region other than the opening 232 in the passivation layer 230 is hatched with oblique lines. Note that the end portion of the opening 232 of the passivation layer 230 illustrated in FIG. 6A is disposed along the end portion of the emitter non-arrangement region 214 of the current sensing unit 210 in a top view. The opening 232 of the passivation layer 230 exposes the emitter arrangement region 216 and the emitter non-arrangement region 214 in a top view.

The emitter non-arrangement region 214 is surrounded by the region in which dummy trench portions 30c are arranged, and the region in which the dummy trench portions 30c are arranged is surrounded by the region in which the dummy trench portions 30d are arranged sandwiching the region where the drift region 18 is exposed at the front surface 21.

The current sensing unit 210 includes the emitter arrangement region 216 and the emitter non-arrangement region 214. The emitter arrangement region 216 and the emitter non-arrangement region 214 are the same as the current sensing unit 210, the emitter arrangement region 216, and the emitter non-arranged region 214 illustrated in FIG. 3A, so the description is omitted.

The emitter non-arrangement region 214 is provided surrounding the emitter arrangement region 216 in a top view. As an example, the external shape of the emitter arrangement region 216 and the emitter non-arrangement region 214 in a top view is rectangular. The emitter non-arrangement region 214 is surrounded by the region in which the dummy trench portions 30c are arranged and the region in which the dummy trench portions 30d are arranged in a top view.

A plurality of trench portions and mesa portions are disposed in the emitter arrangement region 216 and the emitter non-arrangement region 214. In FIG. 6A, a part of the trench portion is illustrated with a broken line. Each trench portion is provided to extend in the Y axis direction. The plurality of trench portions includes the gate trench portions 40. The plurality of trench portions may further include the dummy trench portions 30. The gate trench portion 40 and the dummy trench portion 30 have a structure similar to the gate trench portion 40 and the dummy trench portion 30 provided in the transistor portion 70.

The gate trench portion 40 and the dummy trench portion 30 provided in the current sensing unit 210 of FIG. 6A have a stripe shape. The end portions of the gate trench portion 40 and the dummy trench portion 30 are provided in the drift region 18.

In addition, the dummy trench portion 30c and the dummy trench portion 30d of a lattice shape are provided in the drift region 18 of the outer periphery of the current sensing unit 210. A predetermined interval is provided between the dummy trench portion 30c and the dummy trench portion 30d. This can consequently reduce electric field strength to the end portion of the gate trench portion 40.

Figure 6B:
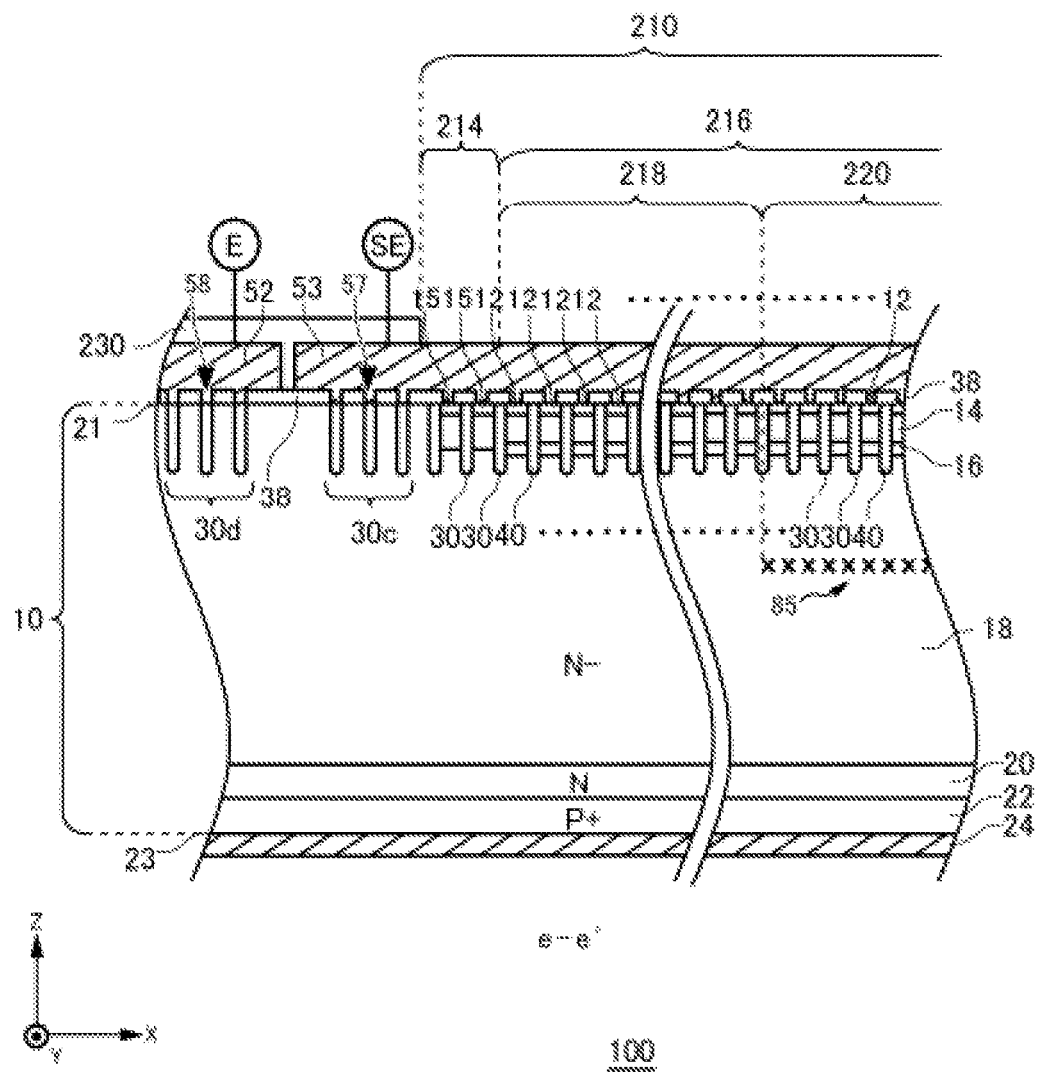
FIG. 6B is a diagram illustrating a cross section e-e' of FIG. 6A.

FIG. 6B is a diagram illustrating a cross section e-e' of FIG. 6A. The cross section e-e' is an XZ plane passing through the emitter region 12 of the current sensing unit 210. The current sensing unit 210 in the present example includes the sense transistor non-irradiation region 218 not provided with the lifetime control region 85 and the sense transistor irradiation region 220 provided with the lifetime control region 85.

A current sensing emitter electrode 53 is provided above the current sensing unit 210. The current sensing emitter electrode 53 is electrically insulated from the emitter electrode 52 provided above the active region 160.

The trench portion, impurity layer, electrode and the like in the current sensing unit 210 may be provided in the same process as the process for providing the transistor portion 70. In the current sensing unit 210, the lifetime control region 85 may be provided in the same process as the process for providing the lifetime control region 85 in the active region 160.

Note that both the sense transistor non-irradiation region 218 and the sense transistor irradiation region 220 are regions provided with the emitter region 12, and are included in the emitter arrangement region 216. In the example of FIG. 6B, the contact region 15 is provided adjacent to the trench portion in the emitter non-arrangement region 214 similar to the example of FIG. 3B.

The area ratio between the sense transistor irradiation region 220 and the sense transistor non-irradiation region 218 is equal to the area ratio between the boundary region 75 in the transistor portion 70 and the region other than the boundary region 75.

Thus, in the current sensing unit 210, the threshold voltages can be adjusted by matching the area ratio of the region provided with the lifetime control region 85 to the transistor portion 70. Note that the gate-emitter ratio is the same as the examples of FIG. 3A to FIG. 3C, and thus the description is omitted.

In the X axis direction, the dummy trench portion 30c adjacent to the emitter non-arrangement region 214 and the dummy trench portion 30d with a predetermined interval from the dummy trench portion 30c are provided in a lattice shape in the drift region 18 on the outer periphery of the current sensing unit 210.

A contact hole 57 is provided in the interlayer dielectric film 38 of the upper surface of the dummy trench portion 30c. The dummy trench portion 30c is electrically connected to the current sensing emitter electrode 53 provided in the upper surface of the interlayer dielectric film 38.

A contact hole 58 is provided in the interlayer dielectric film 38 of the upper surface of the dummy trench portion 30d. The dummy trench portion 30d is electrically connected to the emitter electrode 52 provided in the upper surface of the interlayer dielectric film 38.

The current sensing emitter electrode 53 and the emitter electrode 52 are covered with the passivation layer 230. The passivation layer 230 is provided with an opening at a predetermined position. The current sensing emitter electrode 53 is electrically insulated from the emitter electrode 52.

Note that a plug formed of tungsten or the like may be provided in the contact hole 57 and the contact hole 58. The plug may have a barrier metal on the semiconductor substrate 10 side, and may be embedded with tungsten to be in contact with the barrier metal.

Figure 6C:
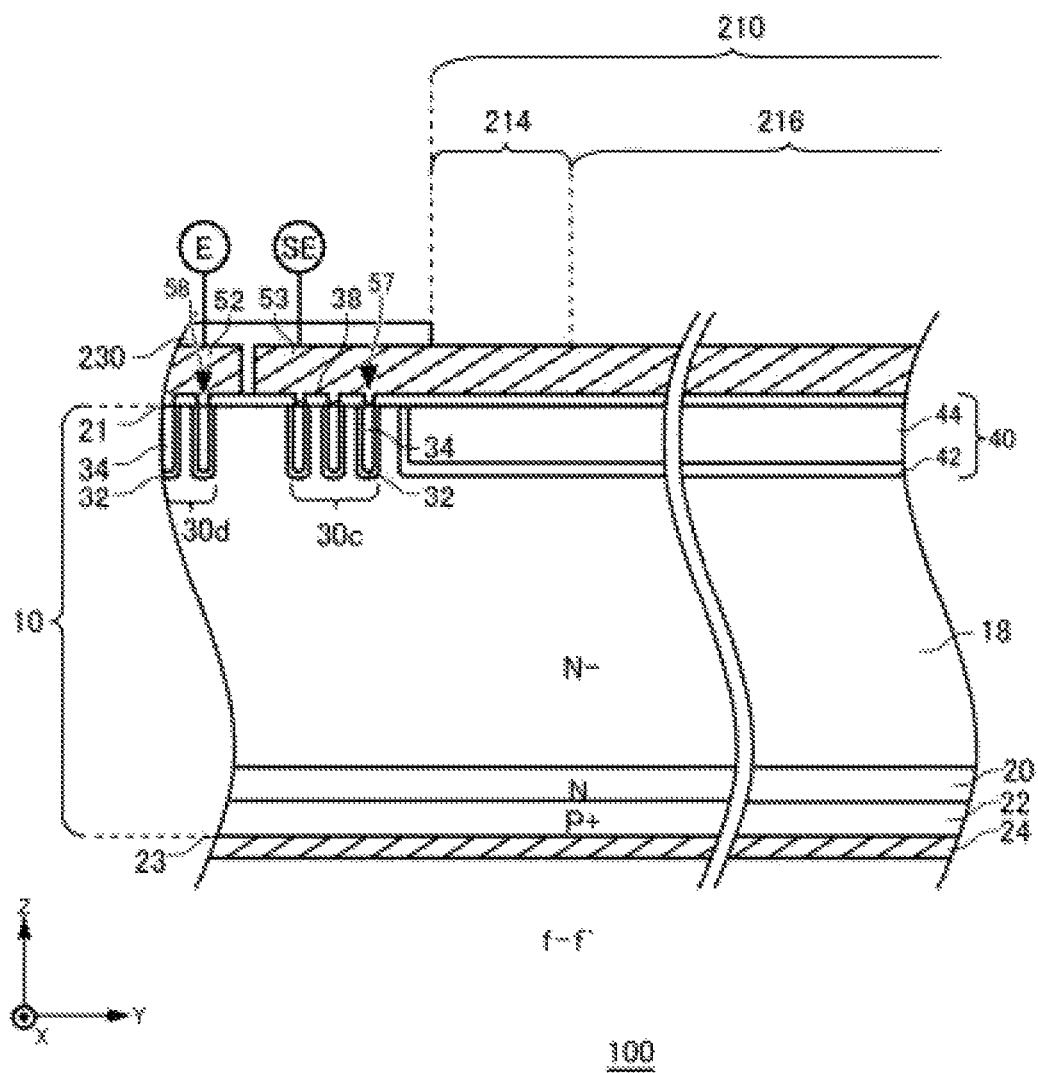
FIG. 6C is a diagram illustrating a cross section f-f' of FIG. 6A.

FIG. 6C is a diagram illustrating a cross section f-f' of FIG. 6A. The cross section f-f' is a cross section in the Y axis direction passing through the gate trench portion 40 of the current sensing unit 210, and shows the negative side of the current sensing unit 210 in the Y axis direction, that is, near the end portion on the edge termination region 190 side. The dummy trench portion 30c and the dummy trench portion 30d include the dummy dielectric film 32 and the dummy conductive portion 34, respectively. The contact hole 57 is provided on the dummy conductive portion 34 of the dummy trench portion 30c. The contact hole 58 is provided on the dummy conductive portion 34 of the dummy trench portion 30d.

The current sensing unit 210 of the present example is surrounded by the drift region 18 and the dummy trench portion 30d. The current sensing unit 210 and the dummy trench portion 30c are separated from the active region 160 by the drift region 18 exposed at the front surface 21.

In the Y axis direction, the dummy trench portion 30c adjacent to the emitter non-arrangement region 214 and the dummy trench portion 30d with a predetermined interval from the dummy trench portion 30c are provided in a lattice shape in the drift region 18 on the outer periphery of the current sensing unit 210.

Although not illustrated in FIG. 6C, the end portion of the gate trench portion 40 of the current sensing unit 210 on the positive side (the active region 160 side) in the Y axis direction may be provided at a position overlapping with the gate runner 48. This can consequently make easy connection between the gate trench portion 40 and the gate runner 48.

In this way, since the current sensing unit 210 includes the sense transistor irradiation region 220, the threshold voltage can be adjusted with the transistor portion 70.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate
11, 11a, 11b, 11c, 11d: well region
12: emitter region
14: base region
15: contact region
16: accumulation region
17: plug region
18: drift region
20: buffer region
21: front surface
22: collector region
23: back surface
24: collector electrode
25: connecting portion
30, 30a, 30b, 30c, 30d: dummy trench portion
31: extension portion
32: dummy dielectric film
33: connecting portion
34: dummy conductive portion
38: interlayer dielectric film
40: gate trench portion
41: extension portion
42: gate dielectric film
43: connecting portion
44: gate conductive portion
48: gate runner
49: contact hole
50: gate metal layer
52: emitter electrode
53: current sensing emitter electrode
54: contact hole
56: contact hole
57: contact hole
58: contact hole
60: mesa portion
61: mesa portion
70: transistor portion
75: boundary region
80: diode portion
82: cathode region
85: lifetime control region
92: guard ring
93: separation region
100: semiconductor device
102: end side
160: active region
180: outer peripheral region
190: edge termination region
210: current sensing unit
214: emitter non-arrangement region
216: emitter arrangement region
216a: end portion
216b: end portion
218: sense transistor non-irradiation region
220: sense transistor irradiation region
222: invalid region
230: passivation layer
232: opening

What is claimed is:

1. A semiconductor device comprising:
a semiconductor substrate including an active region and an outer peripheral region, wherein
the active region includes a transistor portion and a diode portion,
the outer peripheral region includes a current sensing unit,
a lifetime control region including a lifetime killer is provided from the diode portion to at least a part of the transistor portion, and
the current sensing unit includes a sense transistor non-irradiation region not provided with the lifetime control region and a sense transistor irradiation region provided with the lifetime control region.

2. The semiconductor device according to claim 1, wherein
an area ratio between the sense transistor irradiation region and the sense transistor non-irradiation region is equal to an area ratio between a boundary region provided with the lifetime control region and a non-boundary region in the transistor portion.

3. The semiconductor device according to claim 1, further comprising:
a gate metal layer provided above a front surface of the semiconductor substrate;
an emitter electrode provided above the front surface of the semiconductor substrate; and
a plurality of trench portions provided in a front surface side of the semiconductor substrate in the transistor portion, the diode portion, and the current sensing unit, wherein
the plurality of trench portions includes a gate trench portion electrically connected to the gate metal layer and a dummy trench portion electrically connected to the emitter electrode, and
a ratio between a number of the gate trench portions and a number of the dummy trench portions per unit length in the current sensing unit is equal to the ratio in the transistor portion.

4. The semiconductor device according to claim 2, further comprising:
a gate metal layer provided above a front surface of the semiconductor substrate;
an emitter electrode provided above the front surface of the semiconductor substrate; and
a plurality of trench portions provided in a front surface side of the semiconductor substrate in the transistor portion, the diode portion, and the current sensing unit, wherein the plurality of trench portions includes a gate trench portion electrically connected to the gate metal layer and a dummy trench portion electrically connected to the emitter electrode, and
a ratio between a number of the gate trench portions and a number of the dummy trench portions per unit length in the current sensing unit is equal to the ratio in the transistor portion.

5. The semiconductor device according to claim 1, wherein
the current sensing unit includes a first region extending along one of facing end portions of the current sensing unit and a second region extending along another of the facing end portions, and the first region and the second region are one of the sense transistor non-irradiation region or the sense transistor irradiation region.

6. The semiconductor device according to claim 2, wherein
the current sensing unit includes a first region extending along one of facing end portions of the current sensing unit and a second region extending along another of the facing end portions, and the first region and the second region are one of the sense transistor non-irradiation region or the sense transistor irradiation region.

7. The semiconductor device according to claim 3, wherein
the current sensing unit includes a first region extending along one of facing end portions of the current sensing unit and a second region extending along another of the facing end portions, and the first region and the second region are one of the sense transistor non-irradiation region or the sense transistor irradiation region.

8. The semiconductor device according to claim 3, wherein
the current sensing unit further includes an invalid region between the sense transistor non-irradiation region and the sense transistor irradiation region.

9. The semiconductor device according to claim 8, wherein
a trench portion set to have an emitter potential is provided in the invalid region.

10. The semiconductor device according to claim 8, wherein
an upper surface of a mesa portion between the plurality of trench portions provided in the front surface side of the semiconductor substrate in the invalid region is not in contact with the emitter electrode.

11. The semiconductor device according to claim 9, wherein
an upper surface of a mesa portion between the plurality of trench portions provided in the front surface side of the semiconductor substrate in the invalid region is not in contact with the emitter electrode.

12. The semiconductor device according to claim 8, wherein
the transistor portion and the current sensing unit include an emitter region of a first conductivity type which is provided at the front surface of the semiconductor substrate, and
the emitter region is not provided in the invalid region.

13. The semiconductor device according to claim 9, wherein
the transistor portion and the current sensing unit include an emitter region of a first conductivity type which is provided at the front surface of the semiconductor substrate, and
the emitter region is not provided in the invalid region.

14. The semiconductor device according to claim 10, wherein
the transistor portion and the current sensing unit include an emitter region of a first conductivity type which is provided at the front surface of the semiconductor substrate, and
the emitter region is not provided in the invalid region.

15. The semiconductor device according to claim 8, wherein
a separation region of a second conductivity type is provided in the invalid region.

16. The semiconductor device according to claim 8, wherein
the transistor portion and the diode portion include a base region of a second conductivity type which is provided at the front surface of the semiconductor substrate, and
the invalid region includes a well region of the second conductivity type which is provided at the front surface of the semiconductor substrate, and a doping concentration of the well region is higher than a doping concentration of the base region.

17. The semiconductor device according to claim 9, wherein
the transistor portion and the diode portion include a base region of a second conductivity type which is provided at the front surface of the semiconductor substrate, and
the invalid region includes a well region of the second conductivity type which is provided at the front surface of the semiconductor substrate, and a doping concentration of the well region is higher than a doping concentration of the base region.

18. The semiconductor device according to claim 1, further comprising:
a passivation layer configured to cover the current sensing unit, the passivation layer being above a front surface of the semiconductor substrate, wherein
the passivation layer includes an opening located above the sense transistor irradiation region.

19. The semiconductor device according to claim 2, further comprising:
a passivation layer configured to cover the current sensing unit, the passivation layer being above a front surface of the semiconductor substrate, wherein
the passivation layer includes an opening located above the sense transistor irradiation region.

20. The semiconductor device according to claim 18, wherein
an end portion of the opening is disposed so as to overlap an end portion of the sense transistor irradiation region or to entirely cover the sense transistor irradiation region.

* * * * *